United States Patent [19]
Aoki et al.

[11] Patent Number: 5,981,150
[45] Date of Patent: Nov. 9, 1999

[54] METHOD FOR FORMING A RESIST PATTERN

[75] Inventors: Masami Aoki; Shigeru Kambayashi; Junichi Wada; Yasuhiko Sato, all of Kanagawa-ken, Japan

[73] Assignee: Kabushiki Kaisha Toshiba, Kawasaki, Japan

[21] Appl. No.: 08/888,280

[22] Filed: Jul. 3, 1997

[30] Foreign Application Priority Data

Jul. 5, 1996 [JP] Japan ..................................... 8-176435
Jul. 19, 1996 [JP] Japan ..................................... 8-190684

[51] Int. Cl.⁶ ........................................................ G03F 7/20
[52] U.S. Cl. ........................... 430/322; 430/395; 430/494
[58] Field of Search .................................... 430/311, 322, 430/395, 396, 494

[56] References Cited

U.S. PATENT DOCUMENTS 4,379,833  4/1983  Canavello ............................... 430/325
4,921,774  5/1990  Higashiyama ........................... 430/138

FOREIGN PATENT DOCUMENTS 59-124722  7/1984  Japan .

*Primary Examiner*—Kathleen Duda
*Attorney, Agent, or Firm*—Finnegan, Henderson, Farabow, Garrett & Dunner, L.L.P.

[57] ABSTRACT

The present invention provides a method for forming a resist pattern which allows a closest pattern to be formed thus solving a problem of misalignment. A substrate has, on the surface thereof, first and second domains having different reflectivity to first light. A resist covers the first and second domains. The first light illuminates the resist and reflects from the surfaces of the first and second domains. A resist pattern forms in the fashion of self-alignment based on the illuminated and reflected light. The sum of the exposure of the illuminated and reflected light is set above a threshold of exposure by which the resist is sensitized in the first domain and set below the threshold of exposure in the second domain.

14 Claims, 20 Drawing Sheets

METHOD FOR FORMING A RESIST PATTERN

BACKGROUND OF THE INVENTION

1. Field of the Invention

The present invention relates to a method for forming a resist pattern used in fabricating a semiconductor device and the like.

2. Description of the Related Art

Presently, a reduced projection aligner is used as an aligner in the process for fabricating semiconductor devices. The reduced projection aligner allows a high alignment accuracy to be realized in addition to a high resolution because light (ultraviolet rays) passing through a reticle is reduced through a reduced optical system. However, with the recent advancement in the micronization of LSIs, a higher alignment accuracy is required.

It is important to improve the alignment accuracy, reduce the minimum working dimensions in a lithographic process, and increase the integration of the large scale integrated circuit because it is necessary to leave a margin in anticipation of a misalignment. For instance, it is necessary to provide an alignment margin in an underlying wiring pattern in view of the alignment accuracy of a device to prevent a contact hole from shifting from the underlying wire that connects two layers of the upper and lower wiring layers via the contact hole in designing an LSI. Because the alignment margin needs to be thus provided, it is difficult to dispose the underlying wiring pattern closely.

This point will be explained with reference to FIG. 1. As shown in FIG. 1, an underlying wire 160a is designed widely in the vertical and horizontal directions to leave a margin for alignment error for the overlapping contact hole (via hole) 160b on the underlying wire 160a. The contact hole 160b therefore remains positioned on the underlying wire 160a even when a misalignment occurs.

However, the domain of the alignment margin is originally a wasteful domain and poses a problem in the advancement of the integration. It also poses a problem in the performance of the RC delay due to the increase of capacity between wires because the distance between the wires is narrow at the spot where there is the alignment margin.

Meanwhile, it has been impossible to eliminate a misalignment because the alignment is carried out by using an alignment mark. There has been proposed a method of aligning the upper and lower layers in the fashion of self-alignment in the aspect of processing. This method will be explained below by exemplifying the self-alignment of an upper embedded type wire with an underlying contact hole with reference to FIGS. 2A, 2B and 2C.

At first, as shown in FIG. 2A, an insulating layer 162 is formed on an underlying layer 161 and an insulating layer (etching stopping layer) 163 is formed on the insulating layer 162. The stopping layer 163 acts as a layer for stopping RIE (Reactive Ion Etching) in etching an insulating layer 164 to be formed later by means of RIE. The stopping layer 163 is etched to selectively remove a contact hole including an alignment margin thereof.

Next, the insulating layer 164 is formed on the stopping layer 163 and a resist pattern 165 for forming a wire is formed on the insulating layer 164 as shown in FIG. 2B. Then, the insulating layers 164 and 162 are etched by means of RIE to create a groove for forming the wire therein by using the resist pattern 165 as a mask as shown in FIG. 2C.

At this time, while the etching is stopped on the surface of the stopping layer 163 where the contact hole is not created, the etching advances at the part overlapping with the pattern for forming the wire because the stopping layer 163 has been removed where the contact hole exists, so that the contact hole which aligns with the wiring groove is formed in the fashion of self-alignment. Finally, a wiring metal layer (not shown) is filled in the wiring groove and the contact hole, thus completing the wiring.

It is possible to align the upper wire with the underlying contact hole in the fashion of self-alignment in the above-mentioned method applied in the embedded type wiring. However, the lower the pattern, the finer the pattern needs to be in the scaling rule of LSIs, and the higher the pattern, the looser the scaling rule is. Therefore, it is necessary to align the upper pattern accurately with the finer lower pattern. It is difficult, however, to achieve as close a match as possible by using the method described above.

Meanwhile, there is a case in a process of fabricating a MOS transistor when a film is formed on an underlying structure in which a gate is formed and the film should be patterned into a predetermined pattern. It is also difficult, however, to pattern the film without misalignment with this gate in such a case, and an alignment margin is required even though it hampers the integration of LSIs.

As a method for forming an upper pattern on an underlying pattern in the fashion of self-alignment, a method has been disclosed in Japanese Patent Disclosure No. 59-124722, for example. According to this method, a resist which is sensitive to a secondary X-ray is applied on a metal wiring structure formed on a ceramic substrate. An aperture portion of the resist is created only on the metal wire in the fashion of self-alignment by shielding the secondary X-ray emitted from the substrate by the metal wire when X-ray is irradiated from the top of the resist.

This method was invented to form a wiring layer of a ceramic package and cannot be applied to a semiconductor integrated circuit having a contact pattern of arbitrary shape because the contact hole needs to be created at an arbitrary position of an interlayer insulating layer covering an underlying wiring pattern in the semiconductor integrated circuit device.

Accordingly, it is an object of the present invention to provide a method for forming a resist pattern which allows the patterns to be align as close as possible.

SUMMARY OF THE INVENTION

According to the present invention, there is provided a method for forming a resist pattern, comprising steps of preparing a substrate having, on the surface thereof, a plurality of domains having different reflectivity to first light; forming a resist so as to cover the plurality of domains having the different reflectivity; and irradiating the first light to the resist; wherein the first light is reflected on the surface of the plurality of domains, causing second light as reflected light, and a resist pattern is formed in the fashion of self-alignment based on a difference of intensity of reflection of the second light.

In this invention, the plurality of domains having the different reflectivity include first and second domains and a sum of an exposure of the resist exerted by the first light and an exposure of the resist exerted by the second light is set above a threshold of exposure by which the resist is sensitized in the first domain and set below the threshold of exposure in the second domain.

The reflectivity of the first domain to the first light is greater than that of the second domain and the first light is irradiated to the resist in a predetermined pattern including at least part of the first domain and at least part of the second domain to sensitize the resist selectively in a domain in which a domain to which the first light is irradiated overlaps with the first domain.

Further, the first domain is a first electrode and wiring domain composed of at least one of electrode and wire, the step of irradiating the first light to the resist includes a step of irradiating the first light via a photo mask having a light transmitting portion and a light shielding portion, and the photo mask is designed so that a width of an alignment pattern domain attributing to the light transmitting portion is wider than a width of the first electrode and wiring domain.

Further, the resist is a positive type resist and the resist pattern is formed by removing the resist in a domain in which the alignment pattern domain overlaps with the first electrode and wiring domain.

There is also provided a method for forming a resist pattern, further comprising steps of forming an insulating film which transmits the first light and the second light on the first electrode and wiring domain so as to cover the first electrode and wiring domain; exposing the surface of the first electrode and wiring domain by etching the insulating film by using the resist pattern formed on the insulating film as a mask; and forming an upper wiring layer so as to be connected with the first electrode and wiring domain.

Further, there is provided a method for forming a resist pattern, further comprising steps of forming a second electrode and wiring domain under a domain between the first electrode and wiring domains which adjoin each other before forming the first electrode and wiring domain; forming an anti-reflective coating for preventing reflection of the first light selectively on the first electrode and wiring domain; forming an insulating film which transmits the first light and the second light on the anti-reflective coating so as to cover the first electrode and wiring domain; exposing the surface of the second electrode and wiring domain by etching the insulating film by using the resist pattern formed on the insulating film as a mask; and forming an upper wiring layer so as to be connected with the second electrode and wiring domain. Further, the resist is a negative type resist and the resist pattern is formed by leaving the resist on the domain where the alignment pattern domain overlaps with the first electrode and wiring domain.

Further, there is provided a method for forming a resist pattern in which the step for preparing the substrate having, on the surface thereof, the plurality of domains having the different reflectivity comprises steps of forming a transistor containing a gate electrode, a source electrode and a drain electrode and a device separating insulating film for separating the transistor on the substrate made of semiconductor; and forming a semiconductor layer made of the semiconductor on the whole surface of the transistor and device separating insulating film; wherein a sum of an exposure of the resist exerted by the first light and an exposure of the resist exerted by the second light is set above a threshold of exposure by which the resist is sensitized in a domain in which the gate electrode and the device separating insulating film are formed and set below the threshold of exposure in a domain in which the source and drain electrodes are formed.

Further, according to the present invention, there is provided a method for forming a resist pattern, comprising steps of preparing a substrate having, on the surface thereof, a plurality of domains having different reflectivity to first light; forming a resist on the substrate so as to cover the substrate; and irradiating the first light to the resist; wherein the first light is reflected on the surface of the plurality of domains, causing second light as reflected light, and a resist pattern is formed based on irregular reflection of the second light.

In this invention, there is provided a method for forming a resist pattern in which the step of preparing the substrate having, on the surface thereof, the plurality of domains having different reflectivity comprises steps of forming a transistor containing a gate electrode, a source electrode and a drain electrode and a device separating insulating film for separating the transistor on the substrate made of semiconductor; and forming a semiconductor layer made of the semiconductor on the whole surface of the transistor and device separating insulating film while reflecting the difference of levels of the transistor and device separating insulating film; wherein the first light is reflected on the surface of the semiconductor layer reflecting the difference of levels created on the surface of the semiconductor layer and the second light is concentrated to the resist formed on the source electrode and drain electrode to form the resist pattern.

Further, according to the present invention, there is provided a method for forming a resist pattern, comprising steps of preparing a substrate having a luminescent layer on the surface thereof; forming a resist on the substrate so as to cover the luminescent layer and the substrate; irradiating first light to the resist; and irradiating electromagnetic wave to the luminescent layer to cause second light as luminescent light from the luminescent layer; wherein a resist pattern is formed based on a sum of an exposure of the resist exerted by the first light and an exposure of the resist exerted by the second light.

Further, according to the present invention, there is provided a method for forming a resist pattern, comprising steps of preparing a substrate having a conductive layer on the surface thereof; forming a luminescent layer on the conductive layer; forming a resist on the substrate so as to cover the luminescent layer, the conductive layer and the substrate; and applying electric field to the conductive layer to cause second light as luminescent light from the luminescent layer; wherein a resist pattern is formed based on a sum of an exposure of the resist exerted by the first light and an exposure of the resist exerted by the second light.

In these two inventions, the sum of the exposure of the resist exerted by the first light and the exposure of the resist exerted by the second light is set above a threshold of exposure by which the resist is sensitized on the a domain in which the luminescent layer is formed and set below the threshold of exposure on the domain in which the luminescent layer is not formed.

An electrode and wiring layer is also formed under the luminescent layer, the luminescent layer and the electrode and wiring layer are formed in the same pattern, electromagnetic wave is irradiated via a photo mask having a light transmitting portion and a light shielding portion and a width of a domain to which the electromagnetic wave is irradiated is set so as to be wider than a line width of the luminescent layer (electrode and wiring layer). Thereby, the resist is sensitized selectively only on the part where the illumination domain intersects with the luminescent layer (electrode and wiring layer).

As the electromagnetic wave, light such as ultraviolet rays and far ultraviolet rays, electron beam, X-rays and the like may be used.

The luminescent layer contains phosphor. The luminescent layer may be formed by depositing a thin film containing phosphor by means of CVD or the like or by injecting phosphor to a thin film not containing phosphor to transform it as a thin film containing phosphor.

The specific nature of the invention, as well as other objects, uses and advantages thereof, will clearly appear from the description and from the accompanying drawings in which like numerals refer to like parts.

DESCRIPTION OF PREFERRED EMBODIMENTS

Methods for forming a resist pattern according to the preferred embodiments of the present invention will be explained below with reference to the drawings. Before explaining the embodiments in detail, the principle of the embodiments of the present invention will be explained at first.

Figure 4:
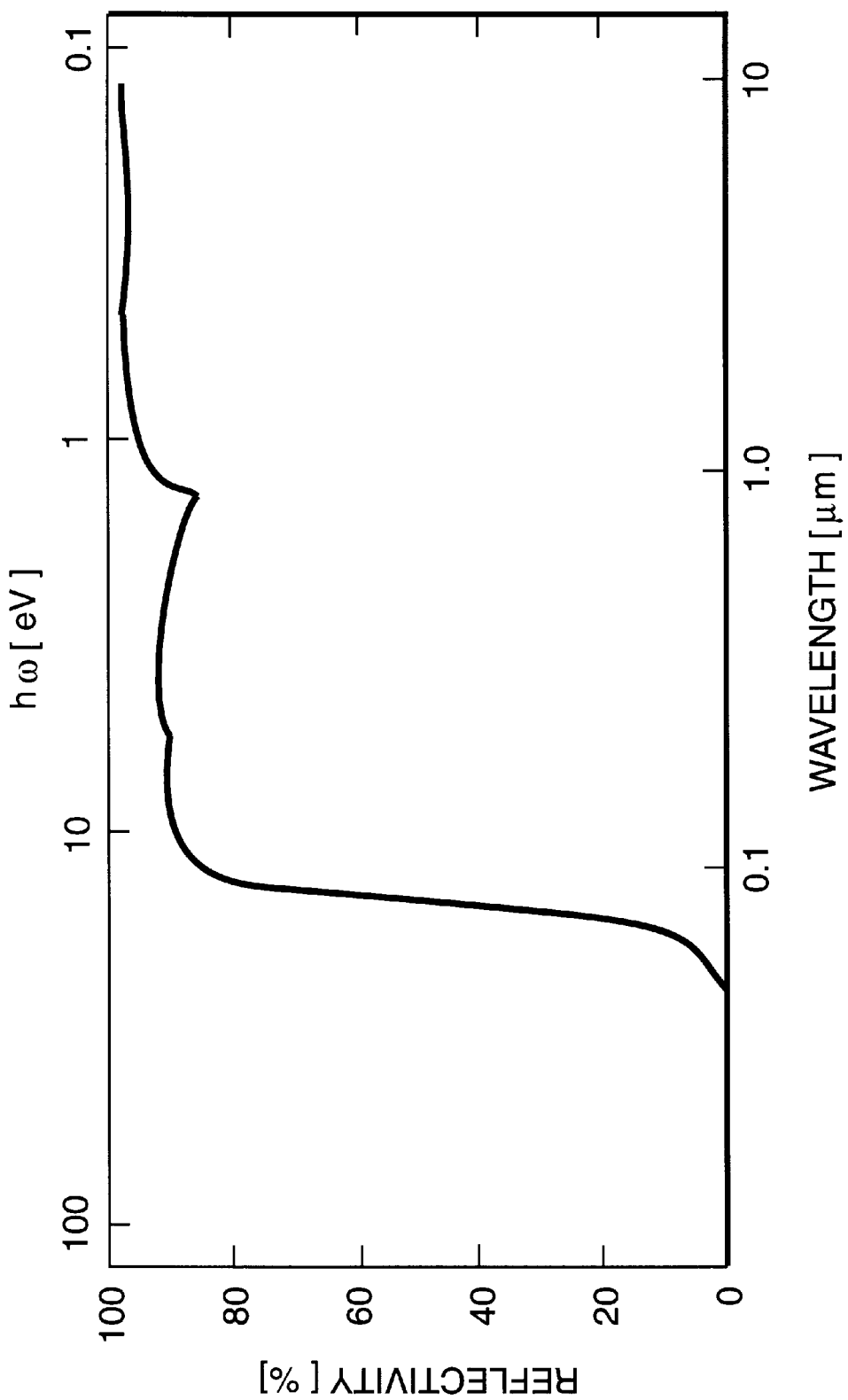
FIG. 4 is a graph showing a relationship between reflectivity of Al and wavelength.
Figure 5:
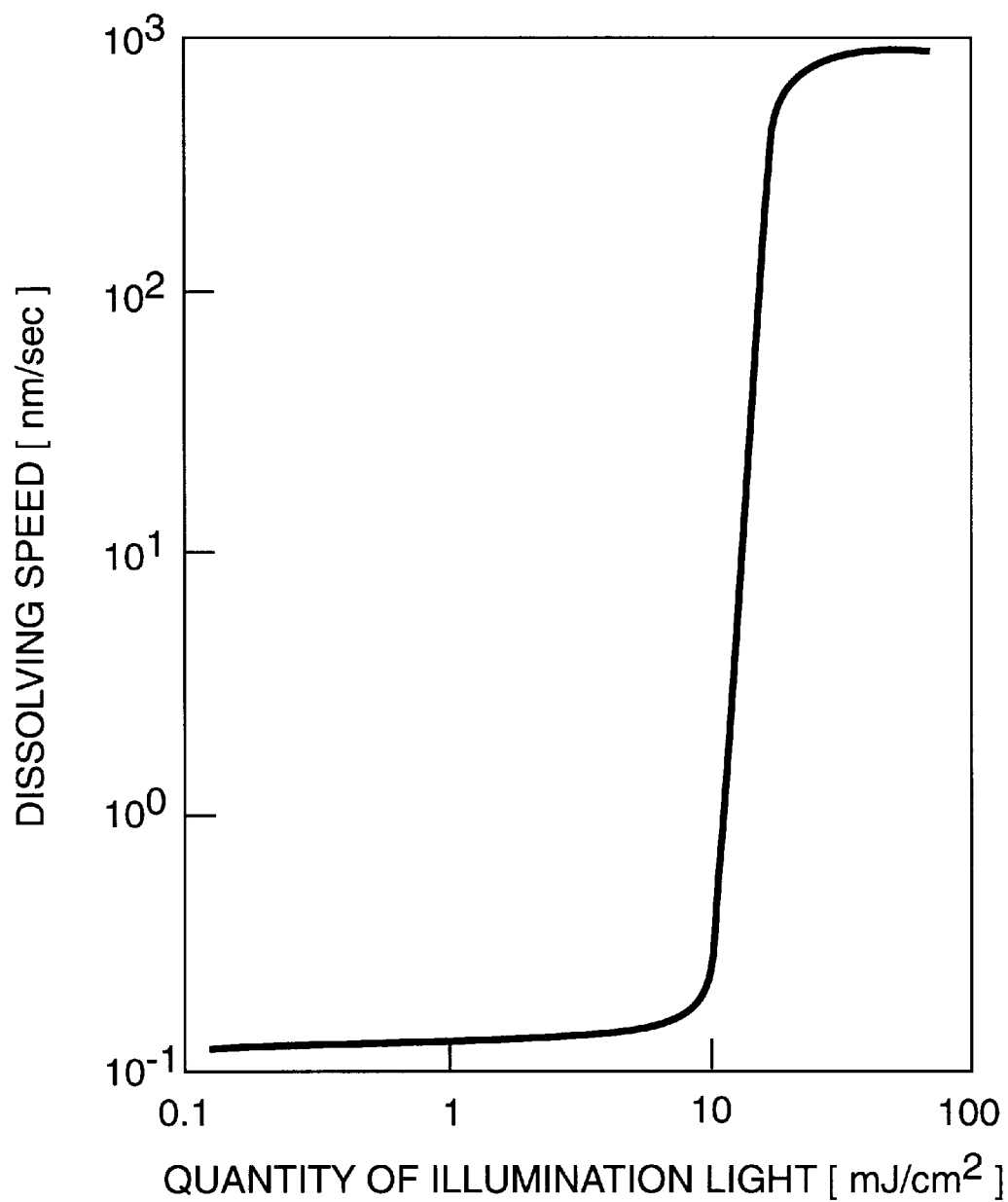
FIG. 5 is a graph showing a relationship between a dissolving speed of a positive type resist to developer and a quantity of irradiated light.

FIG. 4 is a graph showing a relationship between reflectivity of Al and wavelength and FIG. 5 is a graph showing one example of a dissolving speed characteristic of a positive type resist, wherein a vertical axis represents the dissolving speed thereof to developer and the horizontal axis represents a quantity of irradiated light, respectively.

As is apparent from FIG. 4, Al has a high reflectivity of about 90% or more to light in an ultraviolet region such as light in a wavelength (193 nm) of an ArF excimer laser. Further, as is apparent from FIG. 5, the dissolving speed of the positive type resist increases sharply around the boundary of a specific exposure.

In case of the positive type resist shown in FIG. 5, the resist is scarcely sensitized just when illumination light of 10 $mJ/cm^2$ is irradiated to the resist. In the present invention, when an Al pattern exists at the underlying side of the resist, the light which has passed through the resist is reflected by the surface of Al and is absorbed by the resist again. Accordingly, the illumination light is added with the light reflected from the surface of Al on the domain where the Al pattern overlaps with the illumination light, irradiating substantially about 19 $mJ/cm^2$ of light as a result. Because this resist is almost sensitized by this exposure as shown in FIG. 5, only the resist right above the Al pattern may be selectively exposed. Thus, the resist is sensitized in the exposure not less than a certain threshold value and is not sensitized in the exposure less than that value. In view of this fact, embodiments of the present invention will be explained below.

[First Embodiment]

Figure 1:
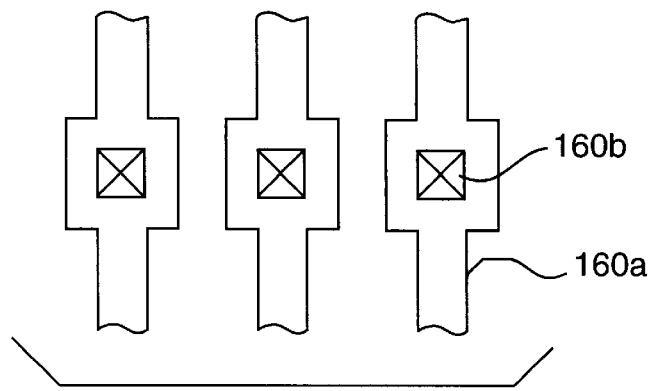
FIG. 1 is a section view of a prior art structure of a wire and a contact hole.
Figure 2A:
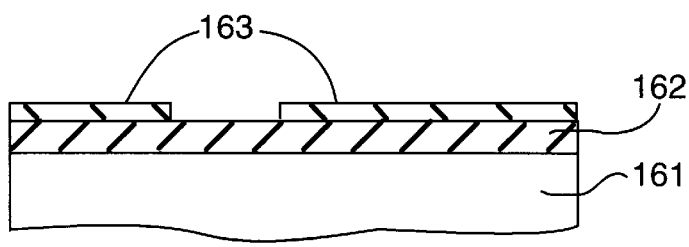
FIGS. 2A through 2C are section views showing one prior art method for forming a wire and a contact hole.
Figure 2B:
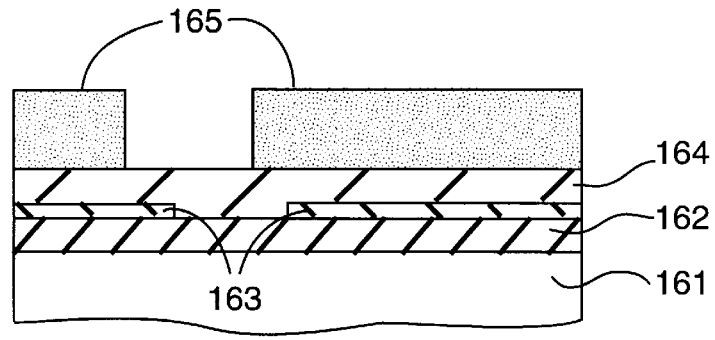
Figure 2C:
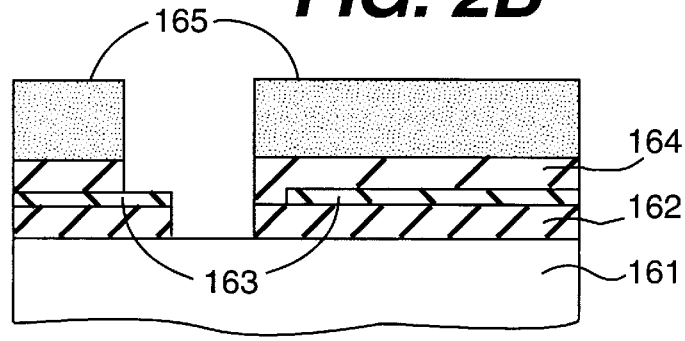
Figure 3A:
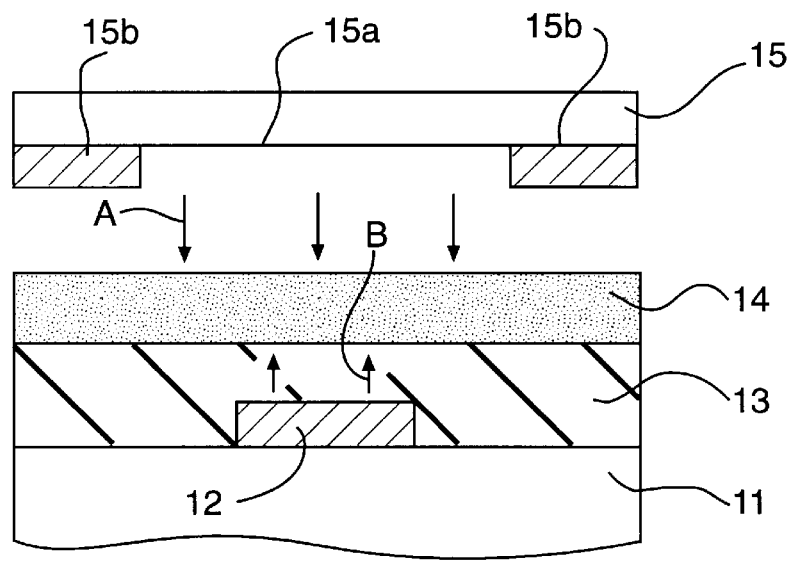
FIGS. 3A through 3C are section views showing a method for forming a resist pattern according to a first embodiment of the present invention.
Figure 3B:
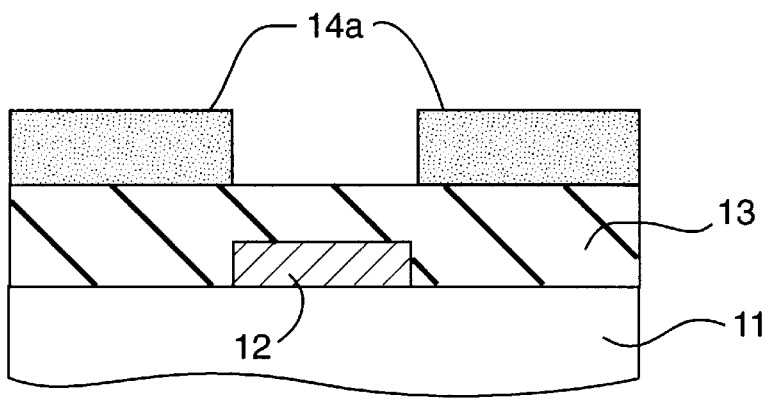
Figure 3C:
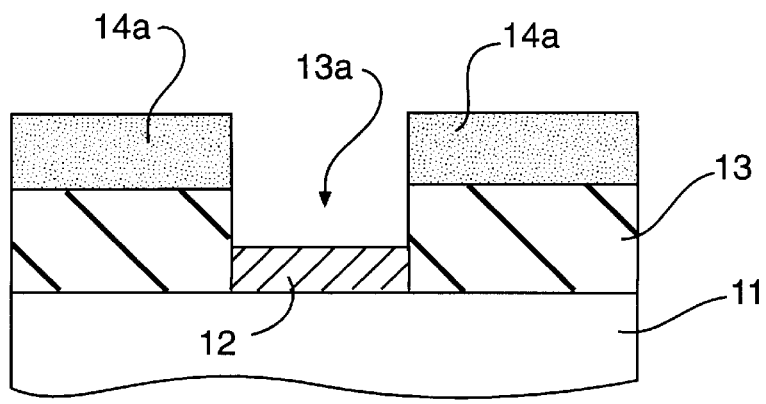

FIGS. 3A through 3C are section views showing a method for forming a resist pattern according to a first embodiment of the present invention. As shown in FIG. 3A, a wiring film 12 made of Al is formed on an underlying substrate 11 made of a silicon substrate, an insulating film or the like and an interlayer insulating film 13 is formed so as to cover the underlying substrate 11 and the wiring film 12. A film having a high transmissivity to illumination light such as CVD silicon oxide is used for the inter layer insulating film 13. Further, a positive type photoresist 14 is formed on the interlayer insulating film 13 and is exposed via a photo mask 15 having a light transmitting portion 15a and a light shielding portion 15b. As shown in FIG. 3A, a pattern width of the illumination light projected on the photoresist 14 is wider than a pattern width of the wiring film 12. It is noted that although the aligning method in equal magnification is drawn in FIG. 3A for convenience, actually reduced alignment using a reduced projection aligner is adopted.

Part of the illumination light A which has passed through the photo mask 15 is absorbed by the photoresist 14 and the remainder thereof reaches the upper face of the wiring film 12 and the upper face of the underlying substrate 11. While the light which has reached the upper face of the wiring film 12 is reflected as reflected light B, the light which has reached the upper face of the underlying substrate 11 is scarcely reflected.

Figure 6A:
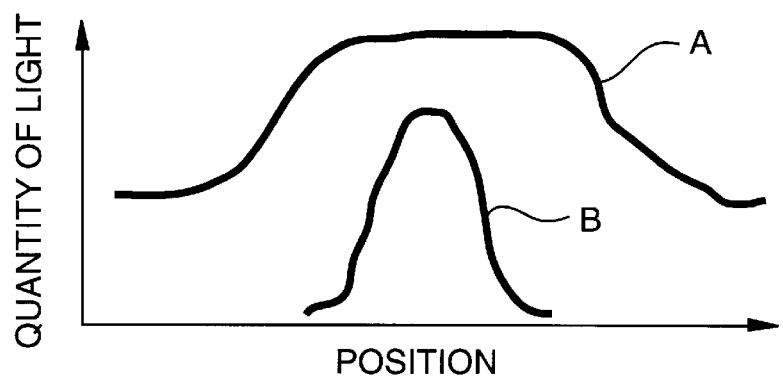
FIG. 6A is a graph showing the distribution of quantity of illumination light and of reflected light and FIG. 6B is a graph showing the distribution of exposure of a photoresist obtained by totaling the illumination light and the reflected light.
Figure 6B:
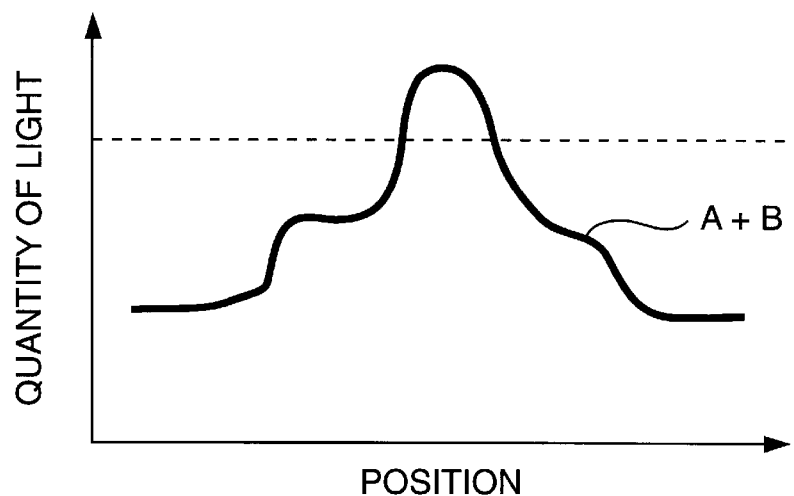

FIG. 6A is a graph showing the distribution of the quantity of the illumination light A and of the reflected light B described above and FIG. 6B is a graph showing the distribution of exposure of the photoresist obtained by totaling the illumination light A and the reflected light B. A dotted line in FIG. 6B represents a threshold value between the exposure by which the photoresist 14 is sensitized and the exposure by which the photoresist 14 is not sensitized. It is then possible to set the sum of the exposure of the resist exerted by the illumination light A and the exposure of the resist exerted by the reflected light B at the exposure by which the photoresist 14 is sensitized on the domain where an illumination domain of the illumination light A overlaps with the domain (first domain) in which the wiring film 12 is formed, and at the exposure by which the photoresist 14 is not sensitized on the domain where the illumination domain of the illumination light A does not overlap with the domain (second domain) in which the wiring film 12 is not formed by appropriately selecting the quantity of illumination light.

Figure 7:
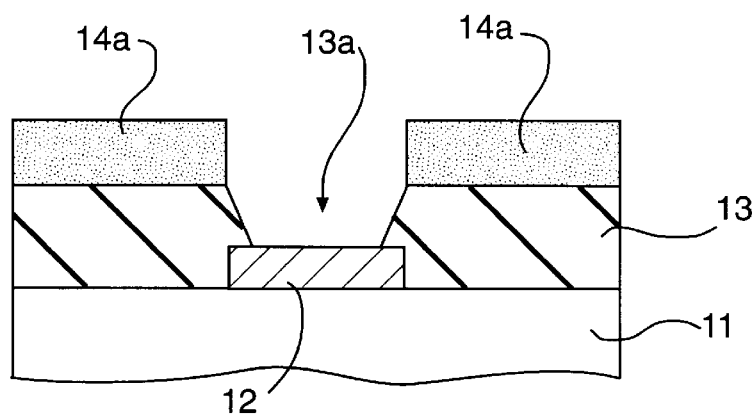
FIG. 7 is a section view showing an example in which the shape of a contact hole is tapered in the first embodiment of the present invention.

After finishing the step in FIG. 3A, the photoresist is developed and is, thereby, removed selectively only from the domain where the illumination domain of the illumination light A overlaps with the domain in which the wiring film 12 is formed. Then, a photoresist pattern 14a is formed in the fashion of self-alignment with respect to the wiring film 12 as shown in FIG. 3B. The interlayer insulating film 13 is then etched by using the photoresist pattern 14a as a mask. As a result, a contact hole 13a is created in the fashion of self-alignment with respect to the wiring film 12 as shown in FIG. 3C. It is noted that the contact hole 13a may be tapered intentionally by reactive ion etching method and so on, as shown in FIG. 7.

As is apparent from the explanation above, it is desirable that the illumination light A is input vertically to the interlayer insulating film 13 and the wiring film 12 and the reflected light B reflects vertically to these films in order to form the photoresist pattern 14a in the fashion of self-alignment with respect to the wiring film 12. It is then desirable that the upper face of the wiring film 12 as well as that of the interlayer insulating film 13 is vertical to the illumination light A at least in the domain where the illumination light A is irradiated in order to meet such a condition. Accordingly, it is desirable that the upper face of the wiring film 12, as well as that of the interlayer insulating film 13, is flat.

Because the photoresist 14 is sensitized selectively only on the domain where the illumination domain of the illumination light A overlaps with the domain in which the wiring film 12 is formed according to the first embodiment described above, the contact hole 13a may be formed in the fashion of self-alignment with respect to the wiring film 12. Therefore, no alignment margin needs to be provided between the pattern of the wiring film 12 and the pattern of the contact hole 13a and the closest wiring film 12 may be realized.

[Second Embodiment]

Figure 8:
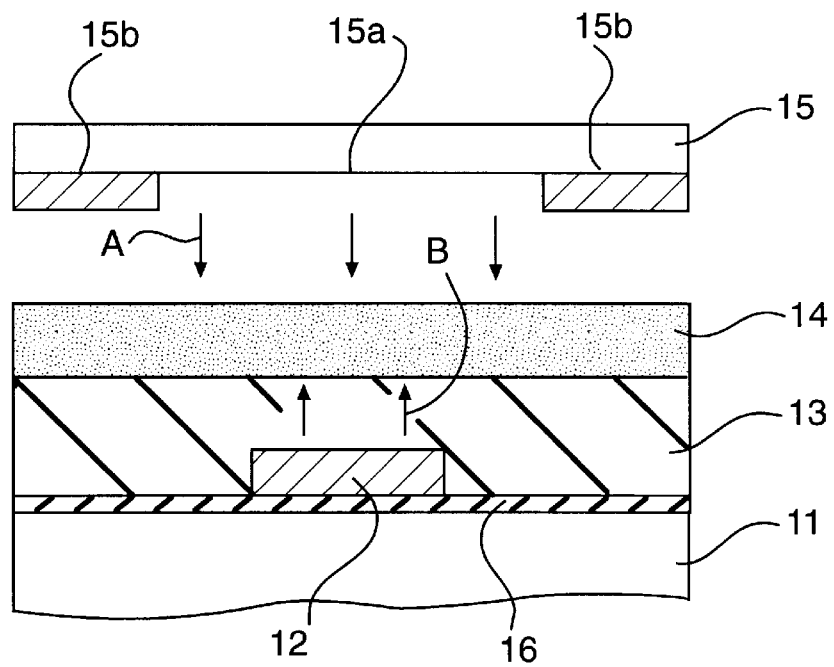
FIG. 8 is a section view showing a method for forming a resist pattern according to a second embodiment of the present invention.
Figure 9:
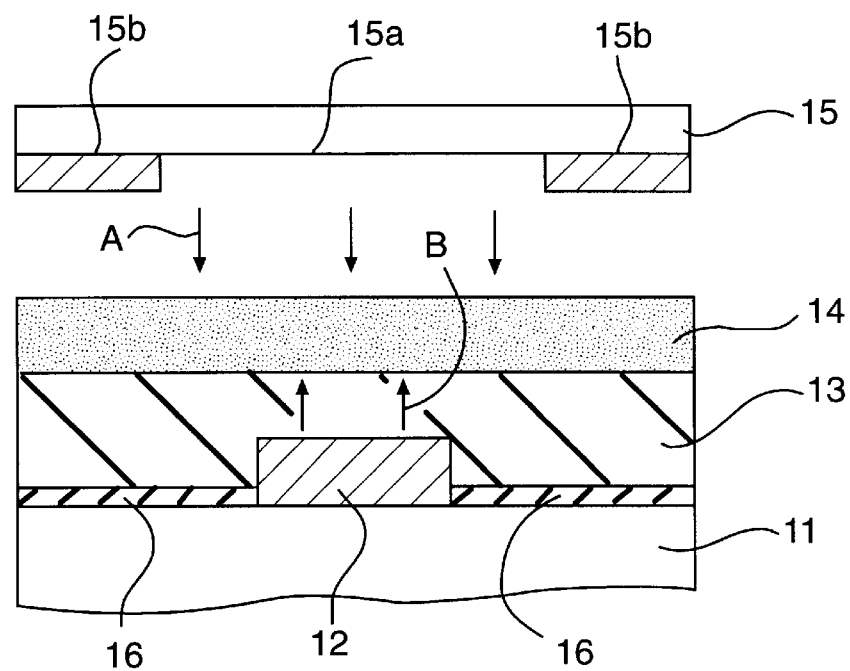
FIG. 9 is a section view showing another method for forming a resist pattern according to the second embodiment of the present invention.

FIGS. 8 and 9 are section views showing methods for forming a resist pattern according to a second embodiment of the present invention. In the present embodiment, an anti-reflective coating 16 is formed on the underlying substrate 11 to prevent reflected light from reaching the underlying substrate 11. A silicon nitride film or the like may be used for the coating 16. The other structure is the same with the structure of the first embodiment shown in FIGS. 3A through 3C. Therefore, the principle for forming a resist pattern and others thereof is the same as that of the first embodiment, and the same operation and effect with the first embodiment may be realized.

While the anti-reflective coating 16 is formed on the whole surface of the underlying substrate 11 in the method shown in FIG. 8, the anti-reflective coating 16 may be formed selectively on part of the underlying substrate 11 on which the wiring film 12 is not formed in the method shown in FIG. 9.

Because the anti-reflective coating 16 is provided in the present embodiment, the contrast of the reflected light from the domain in which the wiring film 12 is formed with the reflected light from the domain in which the wiring film 12 is not formed (the domain in which the anti-reflective coating is formed) may become even greater as compared to the first embodiment shown in FIGS. 3A through 3C.

[Third Embodiment]

Figure 10A:
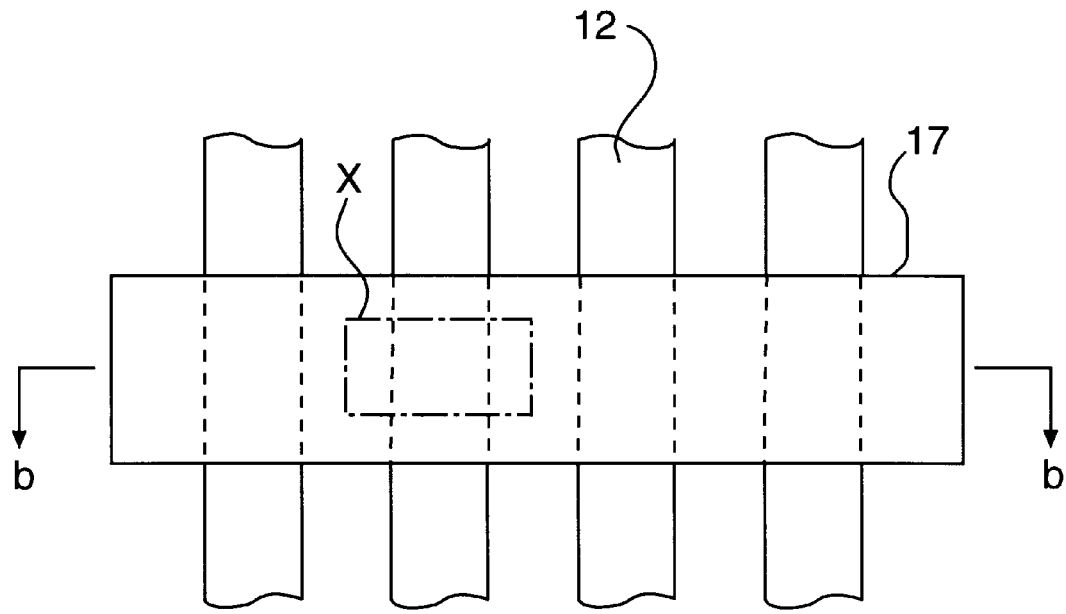
FIGS. 10A and FIG. 10B are upper plan and section views showing, respectively, a method for forming a resist pattern according to a third embodiment of the present invention.
Figure 10B:
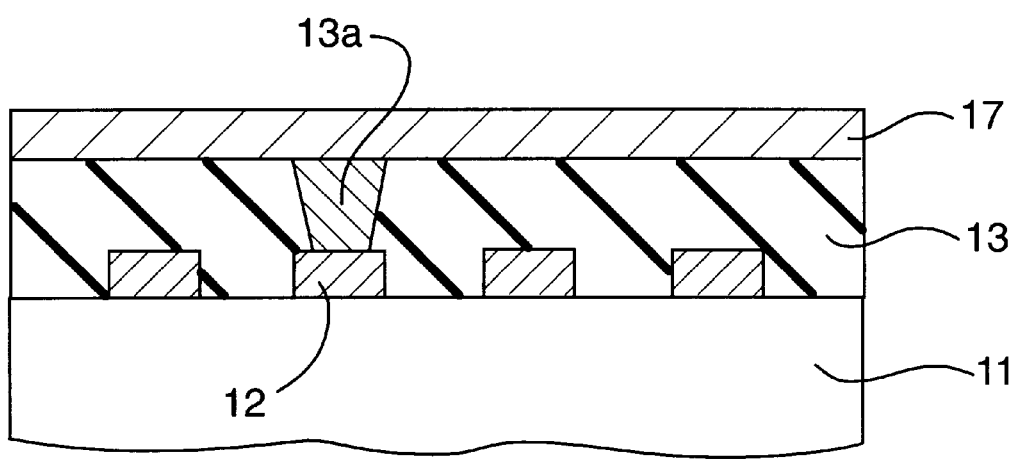

FIGS. 10A and FIG. 10B are upper plan and section views showing, respectively, a method for forming a resist pattern according to a third embodiment of the present invention. According to the present embodiment, the same method with the first embodiment is applied to form a contact hole 13a for connecting the wiring film 12 with a wiring film 17. Therefore, the principle for forming a resist pattern and others thereof is the same with that of the first embodiment, and the same operation and effect with the first embodiment may be realized.

In the present embodiment, the contact hole 13a is formed selectively only at the intersection domain of an illumination domain X of the illumination light and the wiring film 12. That is, the contact hole 13a is formed in the fashion of self-alignment with respect to the wiring film 12. Therefore, no alignment margin needs to be provided between the wiring film 12 and the contact hole 13a, allowing the closest wiring film 12 to be achieved.

Although no anti-reflective coating is provided in the example shown in FIGS. 10A and 10B, it is possible to provide the anti-reflective coating in the same manner with the second embodiment shown in FIGS. 8 and 9.

It is noted that, although Al has been used as the wiring film 12 in each embodiment described above, materials having a higher reflectivity than that of the underlying substrate 11 with respect to the illumination light, such as Cu, W, WSi, poly-silicon and the like, may be used as well as Al.

[Fourth Embodiment]

Figure 11A:
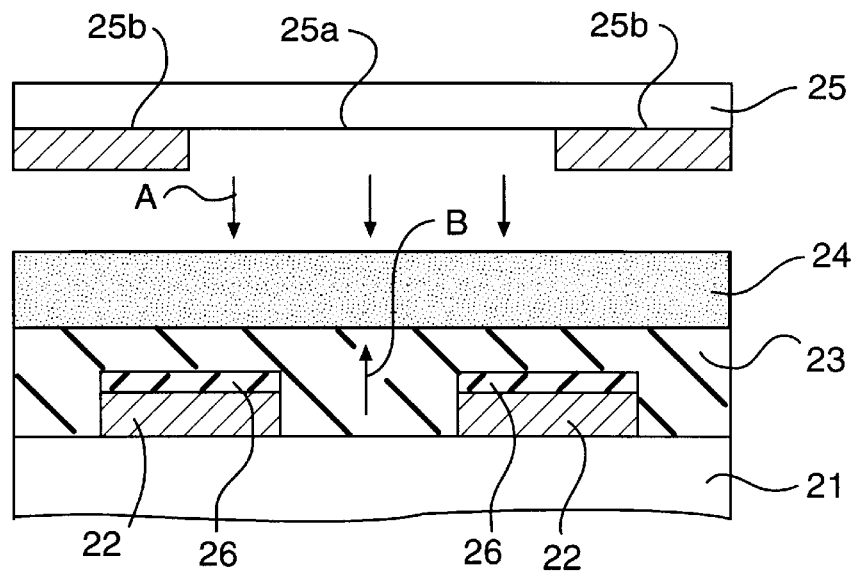
FIGS. 11A through 11C are section views showing another method for forming a resist pattern according to a fourth embodiment of the present invention.
Figure 11B:
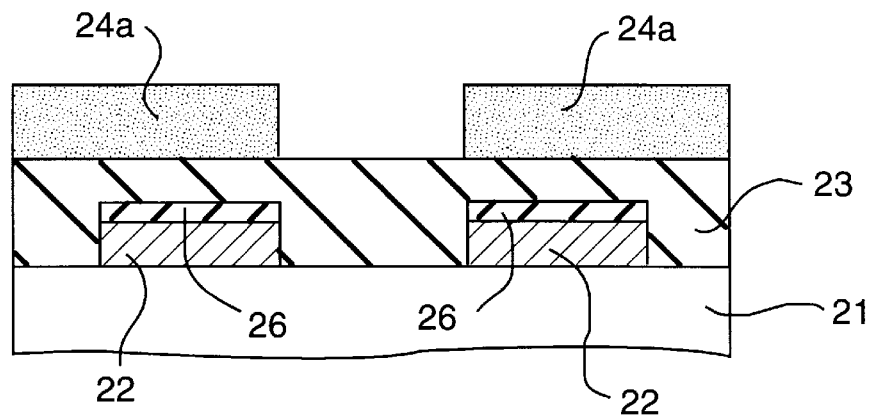
Figure 11C:
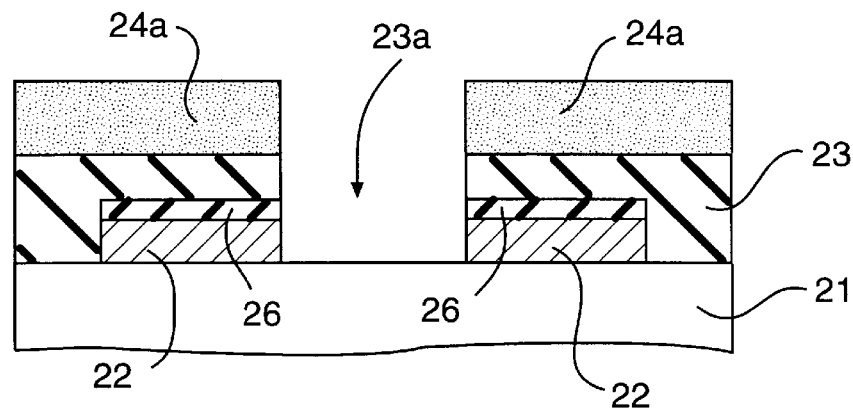

FIGS. 11A through 11C are section views showing a method for forming a resist pattern according to a fourth embodiment of the present invention. Because the basic principle of the present embodiment is the same with that of the first embodiment, reference will be made to the first embodiment as to the matters that are the same as the first embodiment and a detailed explanation thereof will be omitted here.

In FIG. 11A, a wiring film 22 and an interlayer insulating film 23 are first formed on an underlying substrate 21. A film having a high transmissivity to illumination light is used for the interlayer insulating film 23. A positive type photoresist 24 is formed on the interlayer insulating film 23 and is exposed through a photo mask 25 having a light transmitting portion 25a and a light shielding portion 25b. An anti-reflective coating 26 is formed on the wiring film 22 to prevent light from reflecting from the wiring film 22. A carbon film or a titanium nitride film is used for the anti-reflective coating 26.

Part of illumination light A which has passed through the photo mask 25 is absorbed by the photoresist 24 and the remainder thereof reaches the upper face of the underlying substrate 21 and the upper face of the anti-reflective coating 26. While the light which has reached the upper face of the underlying substrate 21 is reflected as reflected light B, the light which has reached the upper face of the anti-reflective coating 26 is scarcely reflected.

Figure 12:
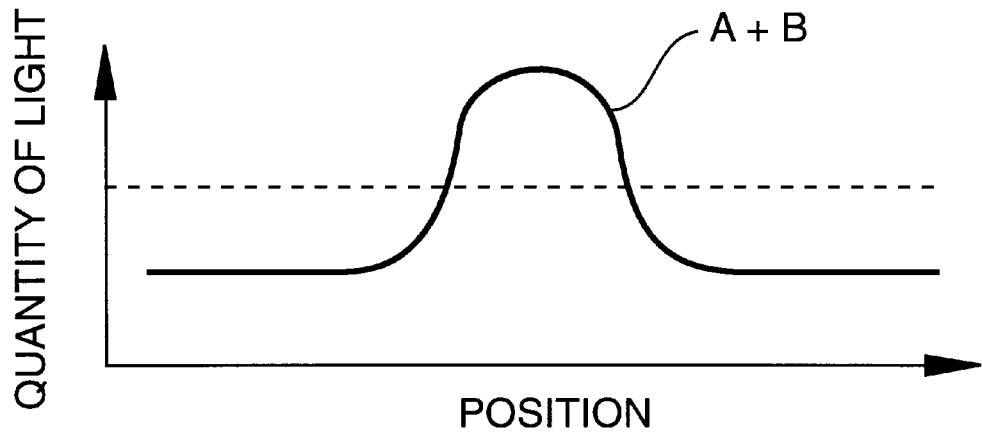
FIG. 12 is a graph showing the distribution of exposure of a photoresist exerted by the illumination light and the reflected light.

FIG. 12 is a graph showing the distribution of exposure of the photoresist 24 exerted by the illumination light and the reflected light. The vertical axis represents a quantity of light and the horizontal axis represents the position in the horizontal direction in FIG. 11A. A dotted line represents a threshold value between the exposure by which the photoresist 24 is sensitized and the exposure by which the photoresist 24 is not sensitized. It is then possible to set the sum of the exposure of the resist exerted by the illumination light A and the exposure of the resist exerted by the reflected light B at the exposure by which the photoresist 24 is sensitized on the domain where the illumination domain of the illumination light A overlaps with the domain (first domain) in which the anti-reflective coating 26 is not formed, and at the exposure by which the photoresist 24 is not sensitized on the domain where the illumination domain of the illumination light A overlaps with the domain (second domain) in which the anti-reflective coating 26 is formed by appropriately selecting the quantity of illumination light.

Figure 13:
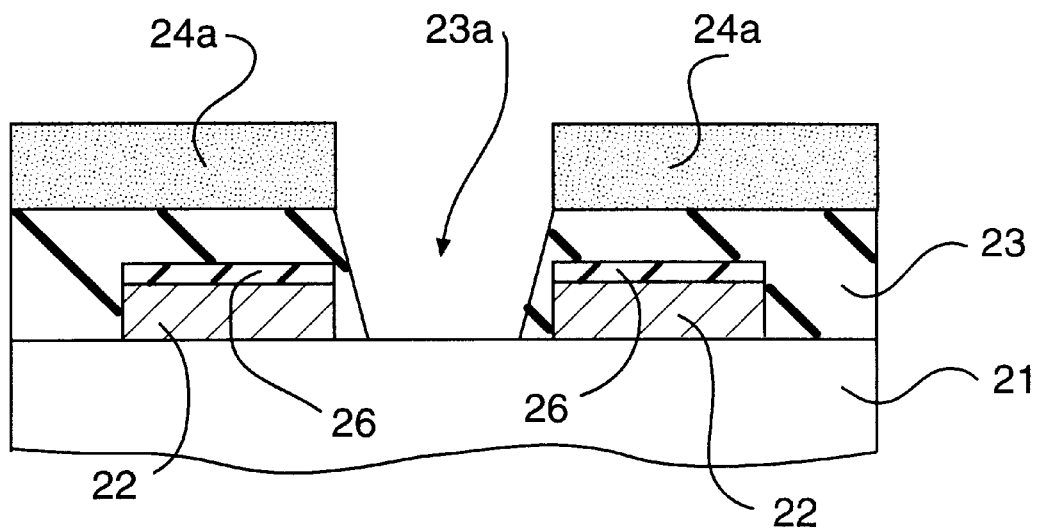
FIG. 13 is a section view showing an example in which the shape of a contact hole is tapered in the fourth embodiment of the present invention.

After finishing the step in FIG. 11A, the photoresist is developed and is, as a result, removed selectively only from the domain where the illumination domain of the illumination light A overlaps with the domain in which the anti-reflective coating 26 is not formed. Then, a photoresist pattern 24a is formed in the fashion of self-alignment with respect to the grooved section between the wiring films 22 as shown in FIG. 11B. The interlayer insulating film 23 is then etched by using the photoresist 24a as a mask and a contact hole 23a is created in the fashion of self-alignment with respect to the grooved section between the wiring films 22 as shown in FIG. 11C. It is possible to form an insulating film selectively on the inner side wall of the contact hole 23a by adopting steps of depositing the insulating film and of anisotropically etching the insulating film. It is noted that the 23a may be tapered as shown in FIG. 13.

[Fifth Embodiment]

Figure 14A:
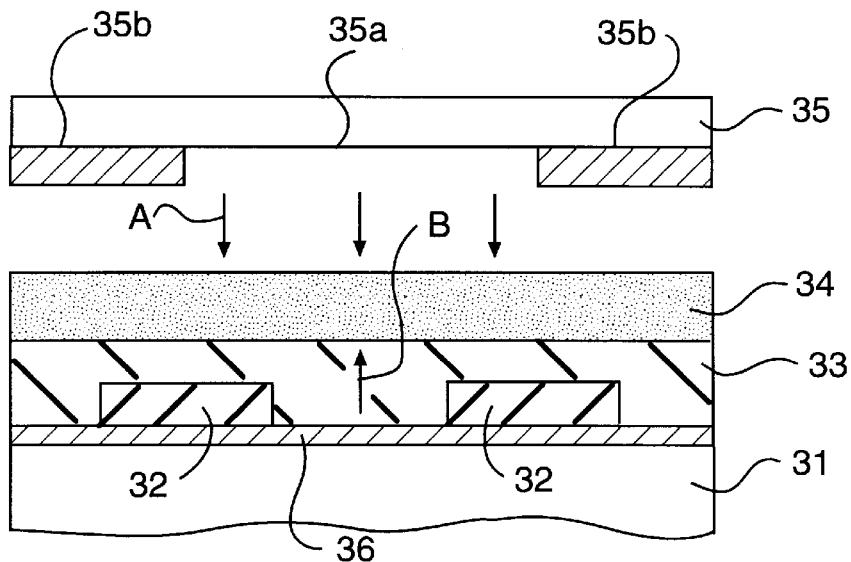
FIGS. 14A through 14C are section views showing a method for forming a resist pattern according to a fifth embodiment of the present invention.
Figure 14B:
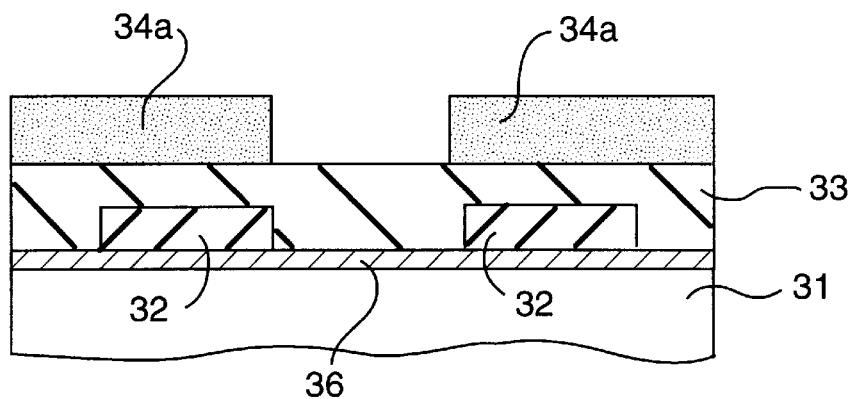
Figure 14C:
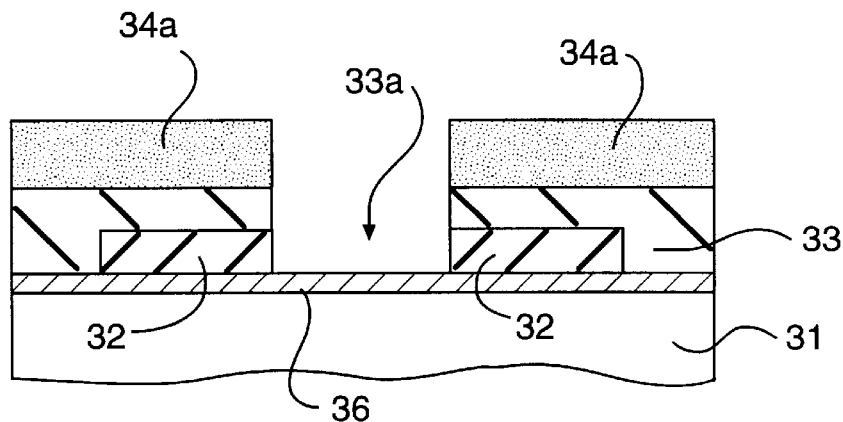

FIGS. 14A through 14C are section views showing a method for forming a resist pattern according to a fifth embodiment of the present invention. Because the basic principle of the present embodiment is the same with that of the first and fourth embodiments described above, reference will be made to the first and fourth embodiments as to the matters which are the same as the first and fourth embodiments, and a detailed explanation thereof will be omitted here.

In FIG. 14A, a film 36 having a high reflectivity is formed on an underlying substrate 31 and a film 32 having a low reflectivity is formed on the film 36 having the high reflectivity. A metal film such as Al, Cu, W or the like may be used for the film 36 having the high reflectivity and a silicon nitride film or the like may be used for the film 32 having the low reflectivity. An insulating film 33 is formed on the film 36 having the high reflectivity and the film 32 having the low reflectivity. As the insulating film 33, a film having a high transmissivity to illumination light is used. A positive type photoresist 34 is formed on the insulating film 33 and is exposed via a photo mask 35 having a light transmitting portion 35a and a light shielding portion 35b.

Similarly to the case described in the first and fourth embodiments, it is possible to set the sum of the exposure of the resist exerted by the illumination light A and the exposure of the resist exerted by the reflected light B from the film 36 having the high reflectivity at the exposure by which the photoresist 34 is sensitized on the domain where the illumination domain of the illumination light A overlaps with the domain (first domain) in which the film 32 having the low reflectivity is not formed, and at the exposure by which the photoresist 34 is not sensitized on the domain where the illumination domain of the illumination light A overlaps with the domain (second domain) in which the film 32 having the low reflectivity is formed by appropriately selecting the quantity of illumination light.

It is noted that because steps shown in FIGS. 14A through 14C may be implemented in the same manner with the fourth embodiment shown in FIGS. 11A through 11C, an explanation thereof will be omitted here.

Figure 15:
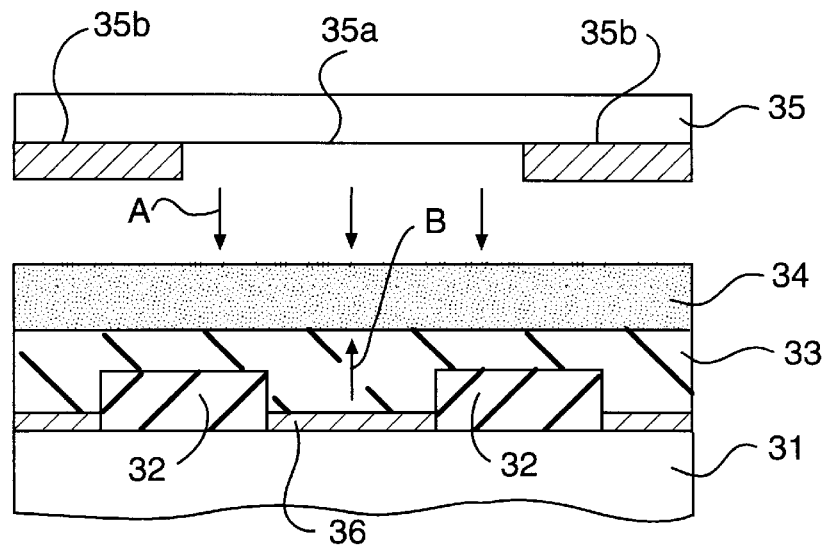
FIG. 15 is a section view showing another method for forming a resist pattern according to the fifth embodiment of the present invention.

FIG. 15 is a section view showing another method for forming a resist pattern according to the fifth embodiment of the present invention. According to this method, the film 36 having the high reflectivity is formed only on the part of the underlying substrate 31 where the film 32 having the low reflectivity is not formed. The other steps are the same with the steps shown in FIGS. 14A through 14C.

[Sixth Embodiment]

Figure 16A:
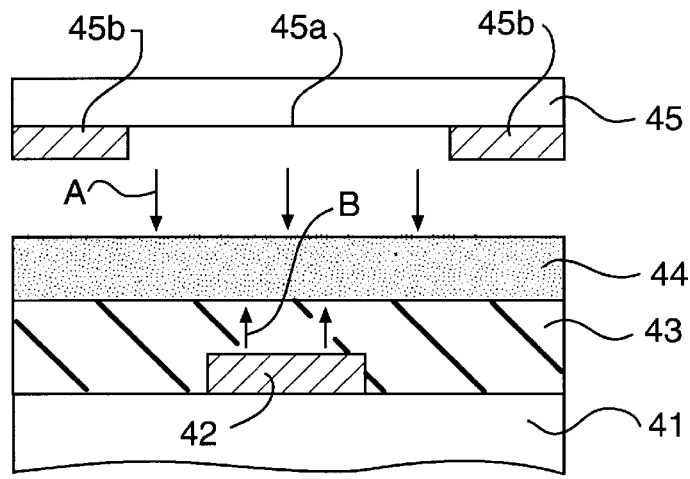
FIGS. 16A and 16B are section views showing a method for forming a resist pattern according to a sixth embodiment of the present invention.
Figure 16B:
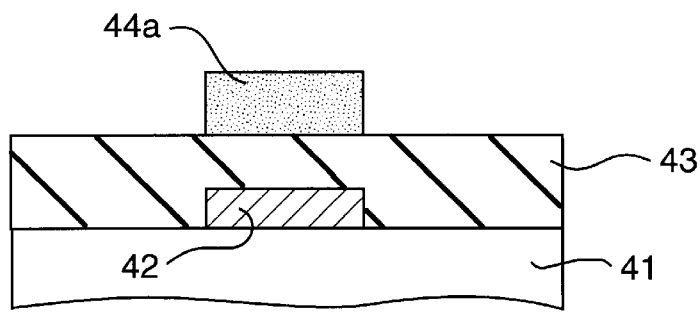

FIGS. 16A and 16B are section views showing a method for forming a resist pattern according to a sixth embodiment of the present invention. While the positive type photoresist has been used in the first through fifth embodiments described above, a negative type photoresist is used in the present embodiment. Because the basic principle and others of the present embodiment are the same with those of the first embodiment and the like, reference will be made to the first embodiment as to the matters same with those embodiments and a detailed explanation thereof will be omitted here.

In FIG. 16A, a film 42 having a high reflectivity is formed on an underlying substrate 41 and an insulating film 43 is formed thereon. A film having a high transmissivity to illumination light is used for the insulating film 43. A negative type photoresist 44 is formed on the insulating film 43 and is exposed via a photomask 45 having a light transmitting portion 45a and a light shielding portion 45b.

Similarly to the case described in the first embodiment and the like, it is possible to set the sum of the exposure of the resist exerted by the illumination light A and the exposure of the resist exerted by the reflected light B at the exposure by which the photoresist 44 is sensitized on the domain where the illumination domain of the illumination light A overlaps with the domain (first domain) in which the film 42 having the high reflectivity is formed, and at the exposure by which the photoresist 44 is not sensitized on the domain where the illumination domain of the illumination light A overlaps with the domain (second domain) in which the film 42 having the high reflectivity is not formed by appropriately selecting the quantity of illumination light.

Therefore, when the photoresist is developed, the photoresist is left selectively only on the domain where the illumination domain of the illumination light A overlaps with the domain in which the film 42 having the high reflectivity is formed, and a photoresist pattern 44a is formed in the fashion of self-alignment with respect to the film 42 having the high reflectivity as shown in FIG. 16B.

[Seventh Embodiment]

FIGS. 17A through 17C and FIGS. 18A through 18C are section views showing a method for forming a resist pattern according to a seventh embodiment of the present invention. In the present embodiment, the present invention is applied to a MOS transistor part of an LSI. A positive type photoresist on a domain (gate domain and device separating domain) other than source and drain domains is selectively sensitized by the same principle with that of the first embodiment and the like to form a resist pattern selectively only on the source and drain domains. A fabrication step thereof will be explained below with reference to FIGS. 17A through 17C and FIGS. 18A through 18C.

Figure 17A:
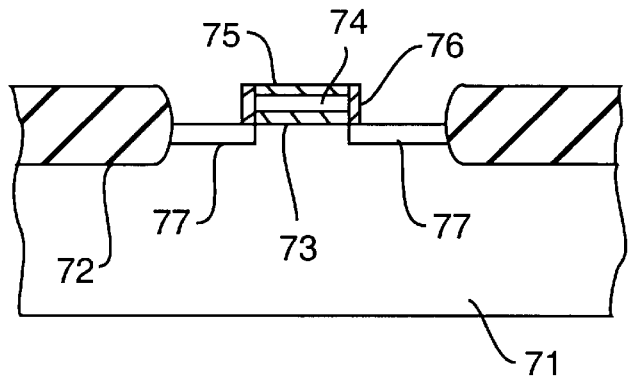
FIGS. 17A through 17C are section views showing a method for forming a resist pattern according to a seventh embodiment of the present invention.

At first, as shown in FIG. 17A, a device separating oxide film 72, a gate oxide film 73 and a gate electrode 74 are formed on a silicon substrate 71. Preferably, a silicon nitride film 75 is formed on the gate electrode 74. Materials other than the silicon nitride may be used or it may not be necessary to form such a film.

Following that, a silicon oxide film 76 is deposited on the whole surface by means of CVD using TEOS (Tetra Ethoxy Silane) and ozone and is etched by means of reactive ion etching. As a result, the silicon oxide film 76 is left selectively on the side wall of the gate electrode 74. Then, an impurity such as As, P, or B is implanted to the source and drain domains 77 and a heat treatment is implemented at 850° C. for activation.

It is noted that, instead of implementing the step of implanting the impurity, the silicon maybe selectively etched by means of chemical dry etching and the like to remove the surface of the silicon substrate in the source and drain domains only to a certain depth. For instance, when a width of the gate is 0.1 μm, the depth of etching is set around 0.03 μm for example.

Figure 17B:
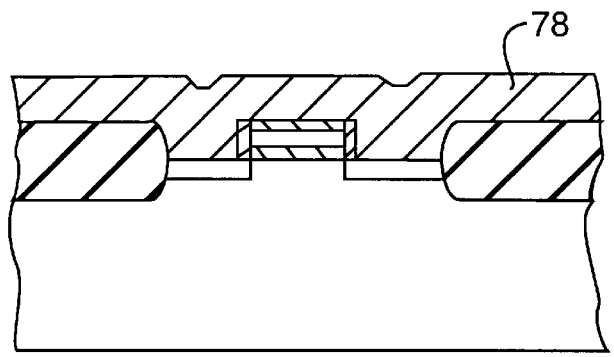

Next, an amorphous silicon film to which an impurity has been doped is deposited on the whole surface by means of CVD or sputtering as shown in FIG. 17B. In case that boron is implanted in the above-mentioned step shown in FIG. 17A, the amorphous silicon film is deposited at 350° C. by using mixed gas of diborane and disilane gases containing the same kind of impurity element.

Following that, a heat treatment is implemented for about two hours at 600° C. within a nitrogen atmosphere in order to mono-crystallize the amorphous silicon film to form a mono-crystal silicon film 78 containing the impurity. The heat treatment may be implemented at a higher temperature in a shorter time, or at a temperature of 600° C. or less for a longer time, provided that it does not interfere with the other process. It is noted that the steps of depositing the amorphous silicon film in which the impurity has been doped and of mono-crystallizing the amorphous silicon film may be used similarly to the steps described above also when the step of removing the surface of the silicon substrate in the source and drain domains is adopted instead of the step of implanting the impurity in the above-mentioned step shown in FIG. 17A. In this case, the amorphous silicon film is deposited directly on the domain from which the silicon substrate has been removed and is mono-crystallized by heat treatment to form the source and drain.

Figure 17C:
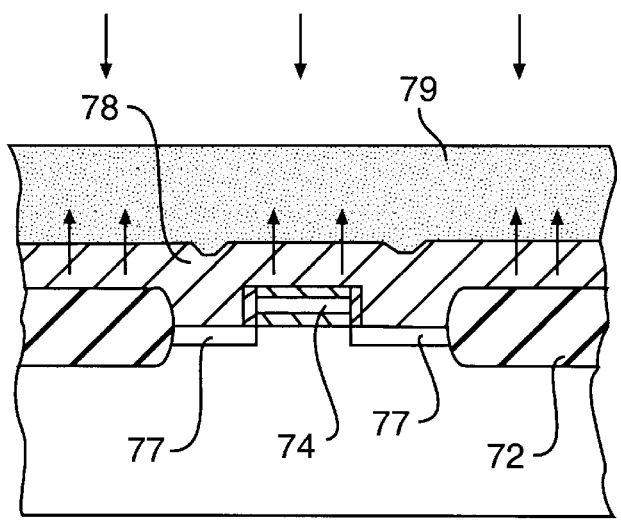

Next, a positive type resist 79 is applied on the silicon film 78 containing the impurity and is exposed as shown in FIG. 17C. Much of light which has reached the domains in which the gate electrode 74 and the device separating oxide film 72 are formed is reflected in those domains and therefore, the resist 79 on those domains is exposed more. Meanwhile, light which has reached the source and drain 77 is not reflected as much because the silicon film 78 containing the impurity and the source and drain 77 are made of the same kind of material, and there exists virtually no interface at the boundary of these films. Accordingly, the resist 79 will be sensitized on the domains where the gate electrode 74 and the device separating oxide film 72 are formed, and will not be sensitized on the domain in which the source and drain 77 is formed.

Figure 18A:
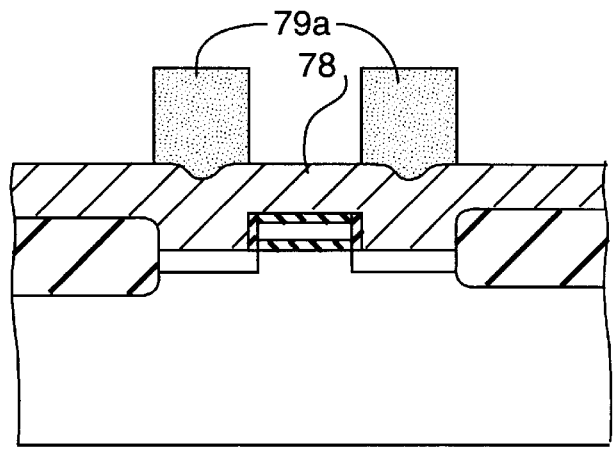
FIGS. 18A through 18C are section views, which continue from FIG. 17C, showing the method for forming the resist pattern according to the seventh embodiment of the present invention.

Next, the resist 79 is developed and a resist pattern 79a is formed selectively only on the domain where the source and drain 77 is formed as shown in FIG. 18A.

Figure 18B:
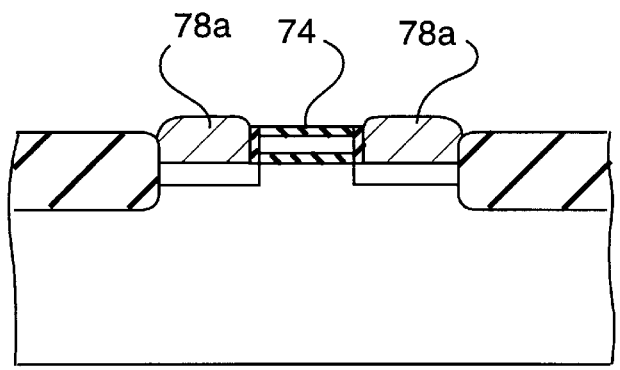

Then, the silicon film 78 containing the impurity is etched anisotropically by means of reactive ion etching by using the resist pattern 79a as a mask to form source and drain electrodes 78a in the fashion of self-alignment with respect to the source and drain 77 as shown in FIG. 18B. Because the source and drain domains 78a are thus formed in the fashion of self-alignment with respect to the gate electrode 74, no alignment margin needs to be taken into consideration. Accordingly, the source and drain domains 78a may be formed so as to have about the same width as the width of the gate electrode even after forming the gate electrode 74.

Figure 18C:
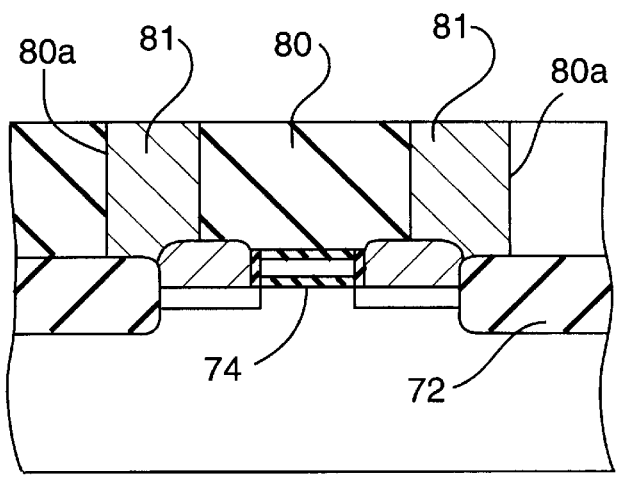

Next, a CVD film formed using TEOS and ozone or a BPSG film is deposited on the whole surface as an interlayer insulating film 80 and is etched by means of reactive ion etching or the like as shown in FIG. 18C. Contact holes 80a are formed in this step. Further, wires 81 made of aluminum or the like are formed within the contact holes 80a.

It is noted that when the contact hole 80a is formed shifting in the outward direction from the pattern of the gate electrode 74, as shown in FIG. 18C, no short occurs between the gate electrode 74 and the wire 81 due to misalignment. Thereby, the part of the wire 81 is formed on the device separating oxide film 72, so that the wiring capacity may be reduced that much.

Because the source and drain domains 78a may be formed in the fashion of self-alignment with respect to the gate electrode 74 by the fabrication method described above, no alignment margin needs to be taken into consideration. Accordingly, the source and drain domains 78a may be formed with a minimum of micro-lithography at the same level as the gate electrode 74.

[Eighth Embodiment]

FIGS. 19A through 19C and FIGS. 20A through 20C are section views showing a method for forming a resist pattern according to an eighth embodiment of the present invention. Similarly to the seventh embodiment described above, the present invention is applied to a MOS transistor part of an LSI in the present embodiment. It is noted that, differing from the first embodiment and the like more or less in principle, a negative type resist on source and drain domains is selectively sensitized by utilizing irregular reflection from the lower structure to form a resist pattern selectively only on the source and drain domains in the present embodiment.

A fabrication step thereof will be explained below with reference to FIGS. 19A through 19C and FIGS. 20A through 20C.

Figure 19A:
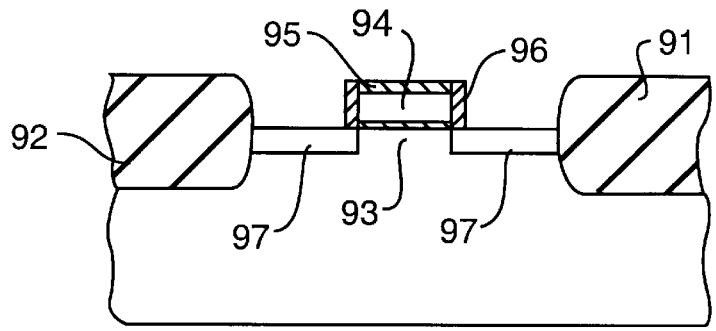
FIGS. 19A through 19C are section views showing a method for forming a resist pattern according to an eighth embodiment of the present invention.

At first, as shown in FIG. 19A, a device separating oxide film 92, a gate oxide film 93 and agate electrode 94 are formed on a silicon substrate 91. Preferably, a silicon nitride film 95 is formed on the gate electrode 94. Materials other than the silicon nitride may be used, or it may not be necessary to form such a film.

Following that, a silicon oxide film 96 is deposited on the whole surface by means of CVD using TEOS and ozone and is etched by means of reactive ion etching. As a result, the silicon oxide film 96 is left selectively on the side wall of the gate electrode 94. Then, an impurity such as As, P and B is implanted to source and drain domains 97, and a heat treatment is implemented at 850° C. for activation. It is noted that instead of implementing the step of implanting the impurity, the silicon may be selectively etched by means of chemical dry etching and the like to remove the surface of the silicon substrate in the source and drain domains only to a certain depth. For instance, when a width of the gate is 0.1 $\mu$m, the depth of etching is set around 0.03 $\mu$m for example.

Figure 19B:
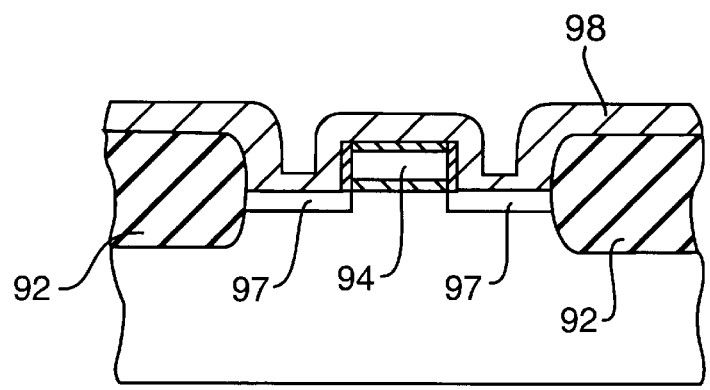

Next, an amorphous silicon film to which impurity has been doped is deposited on the whole surface by means of CVD or sputtering as shown in FIG. 19B. When boron is implanted in the above-mentioned step, shown in FIG. 19A, the amorphous silicon film is deposited at 350° C. by using mixed gas of diborane and disilane gases containing the same kind of impurity element.

Following that, a heat treatment is implemented for about two hours at 600° C. within a nitrogen atmosphere in order to mono-crystallize the amorphous silicon film to form a mono-crystal silicon film 98 containing the impurity. The heat treatment may be implemented at a higher temperature for a shorter time or at a temperature of 600° C. or less for a longer time, provided that it does not interfere with the other process.

The upper face of the silicon film 98 containing the impurity thus formed reflects the shape of the underlying structure. That is, while the upper face of the silicon film 98 containing the impurity is almost flat on the domain in which the gate electrode 94 and the device separating oxide film 92 are formed, it is irregular on the domain in which the source and drain 97 are formed due to the difference of levels of the gate electrode 94 and the device separating oxide film 92.

It is noted that it is possible to deposit the amorphous silicon film in which the impurity has been doped and to mono-crystallize it similarly to the case described above also when the step of removing the surface of the silicon substrate in the source and drain domains is adopted instead of the step of implanting the impurity in the above-mentioned step shown in FIG. 19A. In this case, the amorphous silicon film is deposited directly on the domain from which the silicon substrate has been removed and is mono-crystallized by heat treatment to form the source and drain. It is noted that a metal film or an alloy film may be used instead of the silicon film 98 containing the impurity.

Figure 19C:
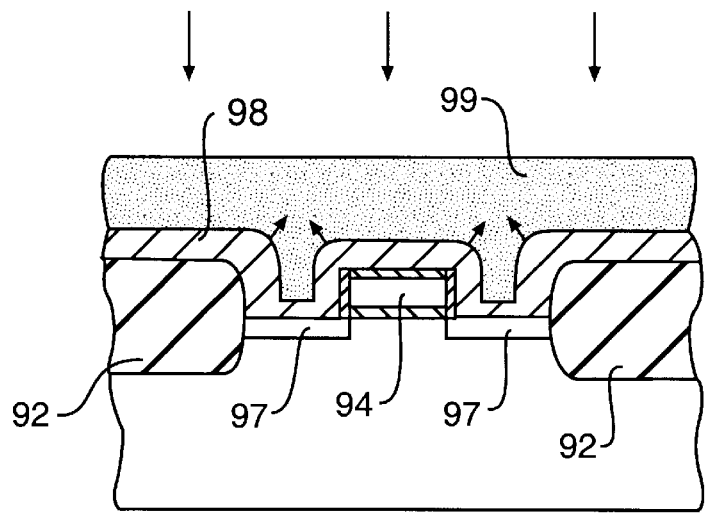

Next, a negative type resist 99 is applied on the silicon film 98 containing the impurity and is exposed as shown in FIG. 19C. Because the upper face of the silicon film 98 containing the impurity is irregular on the domain in which the source and drain 97 are formed, light which reaches this domain reflects irregularly and the resist 99 is exposed that much more. Meanwhile, because the upper face of the silicon film 98 containing the impurity is almost flat on the domain in which the gate electrode 94 and the device separating oxide film 92 are formed, light which reaches this domain scarcely reflects irregularly. Therefore, it is possible to sensitize the resist 99 on the domain in which the source and drain 97 is formed and the resist 99 cannot be sensitized on the domain in which the gate electrode 94 and the device separating oxide film 92 are formed.

Figure 20A:
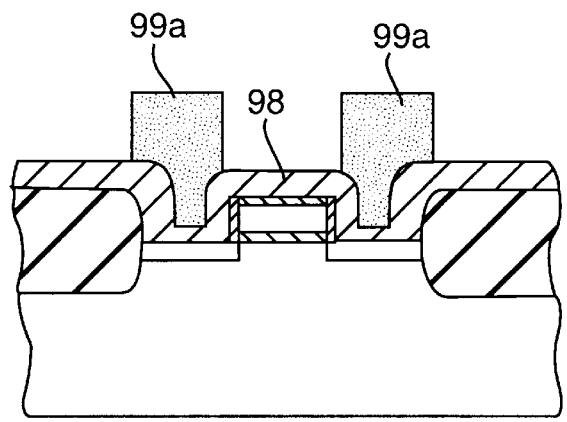
FIGS. 20A through 20C are section views, which continue from FIG. 19C, showing the method for forming the resist pattern according to the eighth embodiment of the present invention.

Next, the resist 99 is developed and a resist pattern 99a is formed selectively only on the domain where the source and drain 97 are formed as shown in FIG. 20A.

Figure 20B:
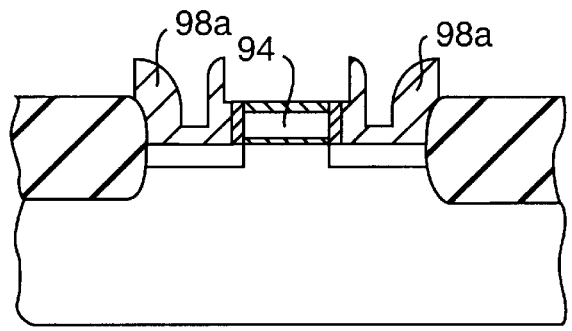

Then, the silicon film 98 containing the impurity is etched anisotropically by means of reactive ion etching by using the resist pattern 99a as a mask to form source and drain electrodes 98a in the fashion of self-alignment with respect to the source and drain 97 as shown in FIG. 20B. Because the source and drain domains 98a thus formed are formed in the fashion of self-alignment with respect to the gate electrode 94, no alignment margin needs to be taken into consideration. Accordingly, the source and drain domains 98a may be formed so as to have about the same width as a width of the gate electrode even after forming the gate electrode 94.

Figure 20C:
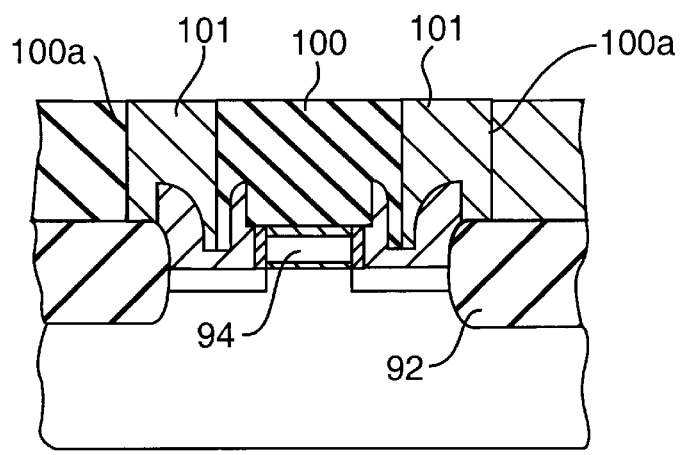

Next, a CVD film formed using TEOS and ozone or a BPSG film is deposited on the whole surface as an interlayer insulating film 100 and is etched by means of reactive ion etching or the like as shown in FIG. 20C. Contact holes 100a are formed in this step. Further, wires 101 made of aluminum or the like are formed within the contact holes 100a. It is noted that when the contact hole 100a is formed shifting in the outward direction from the pattern of the gate electrode 94 as shown in FIG. 20C, no short occurs between the gate electrode 94 and the wire 101 due to misalignment. Thereby, the part of the wire 101 is formed on the device separating oxide film 92, so that wiring capacity may be reduced.

Because the source and drain domains 98a may be formed in self-alignment to the gate electrode 94 by the fabrication method described above, no alignment margin needs to be taken into consideration. Accordingly, the source and drain domains 98a may be formed with a minimum of micro-lithography at the same level as the gate electrode 94.

When the characteristic of the device thus created by the method of the present embodiment was evaluated by measuring a delay time of a CMOS ring oscillator, the delay time was 15 psec/stage owing to the reduction of resistance and the like effected by the enhancement of the integration. Because delay time of a ring oscillator using a device having a conventional structure created by the rule of 0.2 $\mu$m is 30 psec/stage, it has been proven that the operating speed can be improved considerably by the present invention.

[Ninth Embodiment]

Figure 21A:
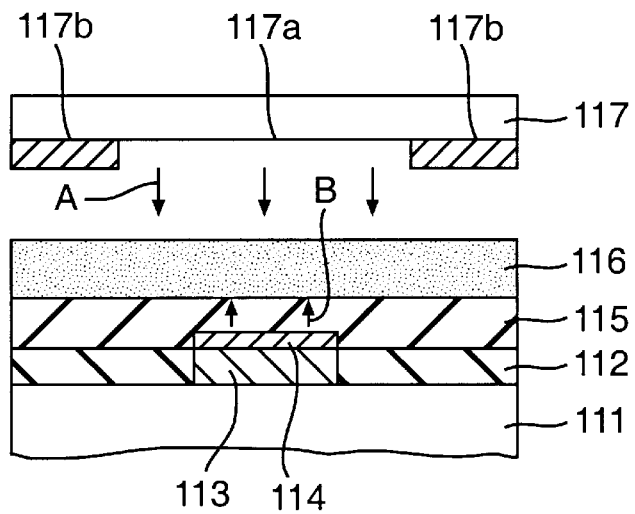
FIGS. 21A through 21C are section views showing a method for forming a resist pattern according to a ninth embodiment of the present invention.
Figure 21B:
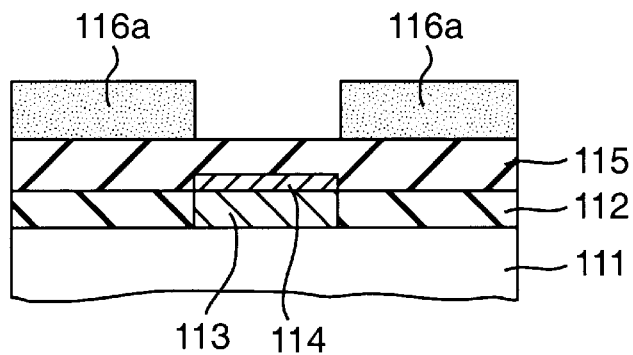
Figure 21C:
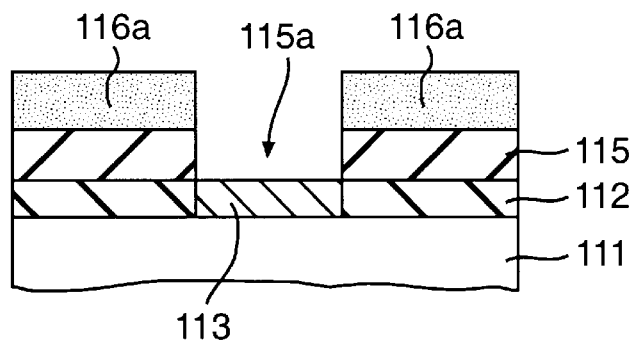

FIGS. 21A through 21C are section views showing a method for forming a resist pattern according to a ninth embodiment of the present invention. In FIG. 21A, an insulating film 112 having a groove is formed on an underlying substrate 111 made of a semiconductor and the like. A wiring layer 113 is embedded in the groove of the insulating layer 112. A luminescent layer 114 containing phosphor (a substance generating a phosphorescence) is formed on the upper face of the wiring layer 113 in the same pattern with the wiring layer 113. The luminescent layer 114 emits luminescent light B when it receives illumination light A. A substance which causes a luminescent phenomenon such as ZnS, ZnO, CaWO$_4$ or the like is used as the phosphor described above.

An interlayer insulating film 115 is formed on the insulating layer 112 and the luminescent layer 114 by using a material having a high transmissivity to the illumination light A and the luminescent light B, like a silicon oxide formed by means of CVD. A positive type resist 116 is formed on the interlayer insulating layer 115 and is exposed using a photo mask 117 having a light transmitting portion 117a and a light shielding portion 117b. The light transmitting portion 117a is patterned as an opening. As shown in FIG. 21A, a width of the opening pattern of the illumination light A projected on the resist 116 is wider than the pattern width of the luminescent layer 114 and the wiring layer 113. It is noted that although the aligning method in equal magnification is drawn for convenience in FIG. 21A, reduced alignment is actually implemented by using a reduced projection aligner.

The illumination light A which has passed through the photo mask 117 reaches the luminescent layer 114 via the resist 116 and the interlayer insulating layer 115 and due to the exciting effect of the illumination light A, the luminescent layer 114 emits the luminescent light B having a wavelength longer than that of the illumination light A. Here, a resist which is sensitized only by the luminescent light B is used, so that the resist 116 only right above the luminescent layer 114 is selectively sensitized. That is, the resist 116 is sensitized selectively only on the domain where the illumination domain of the illumination light A intersects the domain in which the luminescent layer 114 is formed.

After finishing the step in FIG. 21A, the resist 116 is developed and only the resist 116 sensitized by the luminescent light B from the luminescent layer 114 is removed. As a result, a resist pattern 116a is formed in the fashion of self-alignment with respect to the wiring layer 113 and the luminescent layer 114 as shown in FIG. 21B. Then, the interlayer insulating layer 115 is etched anisotropically using this resist pattern 116a as a mask to form a contact hole 115a in the fashion of self-alignment with respect to the wiring layer 113 and the luminescent layer 114 as shown in FIG. 21C. At this time, the luminescent layer 114 may be removed at the same time.

It is necessary to sensitize only the resist right above the luminescent layer 114 in order to form the resist pattern 116a in the fashion of self-alignment with respect to the luminescent layer 114. To that end, it is desirable that the upper face of the luminescent layer 114, as well as the upper face of the interlayer insulating layer 115, is flat.

Figure 22A:
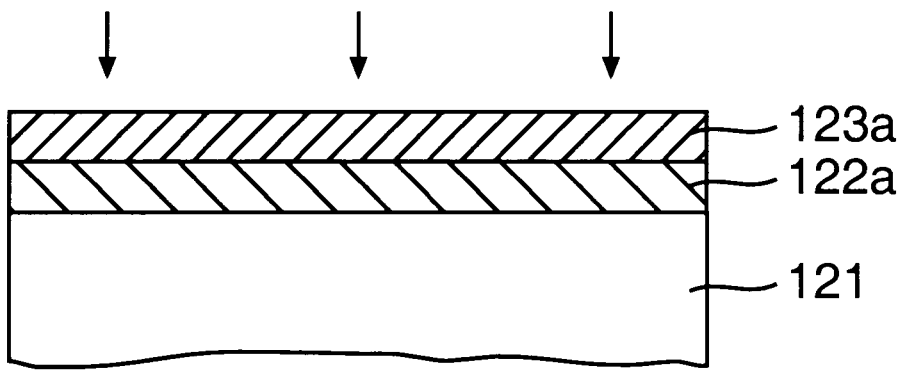
FIGS. 22A and 22B are section views showing another method for forming a resist pattern according to the ninth embodiment of the present invention.
Figure 22B:
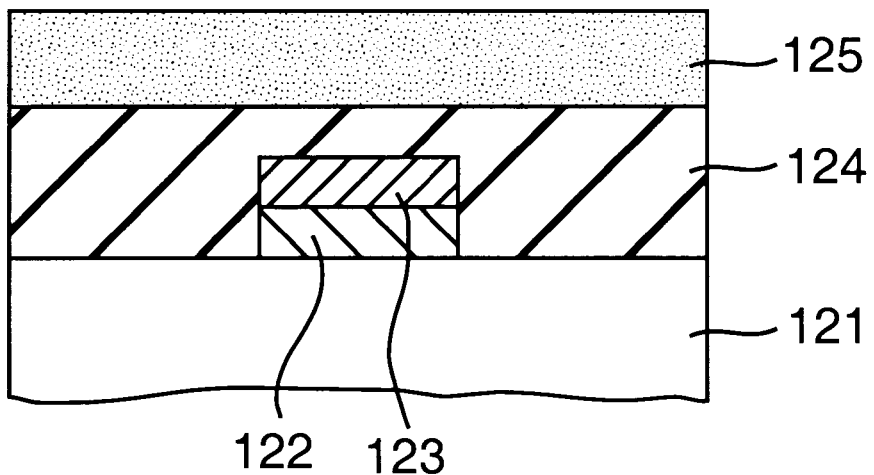

It is noted that although it is possible to form the luminescent layer 114 as a thin film containing phosphor, it is also possible to form it by injecting (implanting) phosphor into a film coating on the upper face of a wire. FIGS. 22A and 22B are section views showing the method of injecting phosphor.

At first, as shown in FIG. 22A, a conductive layer 122a made of poly-silicon or the like is formed on an underlying substrate 121 and phosphor is injected directly on the conductive layer 122a to transform the upper part of the conductive layer 122a to a luminescent layer 123a. Next, as shown in FIG. 22B, the conductive layer 122a and the luminescent layer 123a are removed selectively by using the same mask to form a pattern of a conductive layer 122 and a luminescent layer 123. An interlayer insulating film 124 and a resist 125 are formed in order above the pattern of the conductive layer 122 and the luminescent layer 123. After that, the exposure, development and etching are implemented in the same manner as the embodiments described above.

[Tenth Embodiment]

Figure 23A:
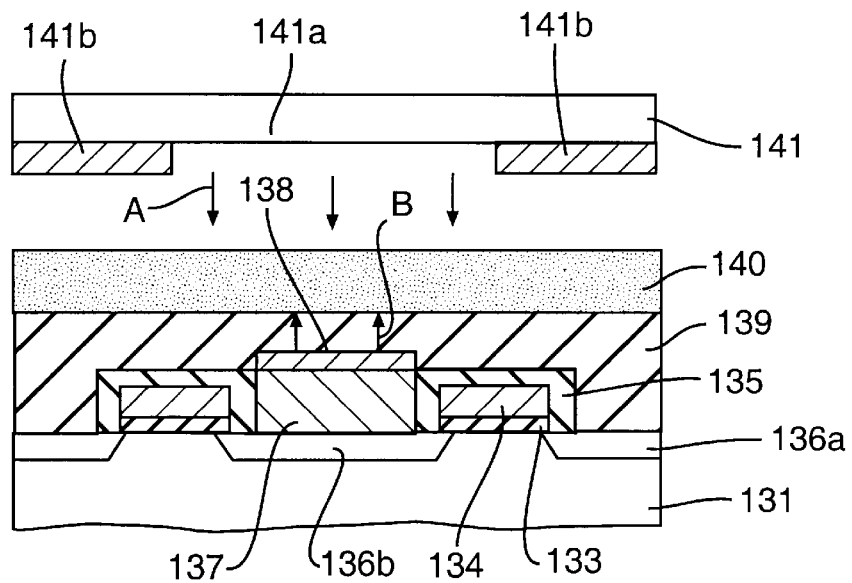
FIGS. 23A through 23C are section views showing a method for forming a resist pattern according to a tenth embodiment of the present invention.
Figure 23B:
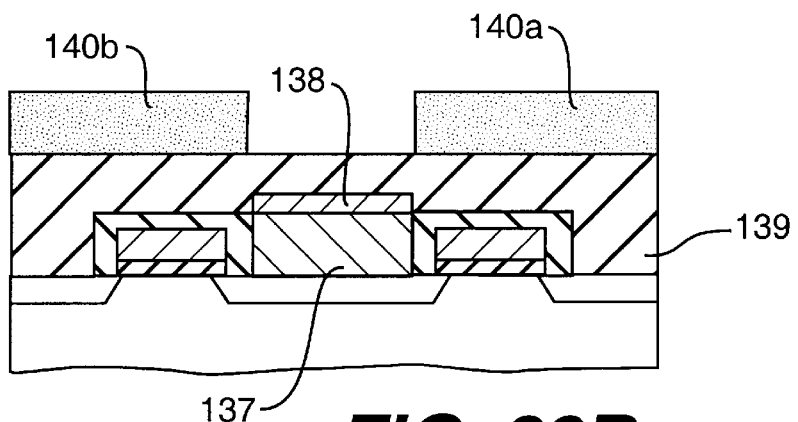
Figure 23C:
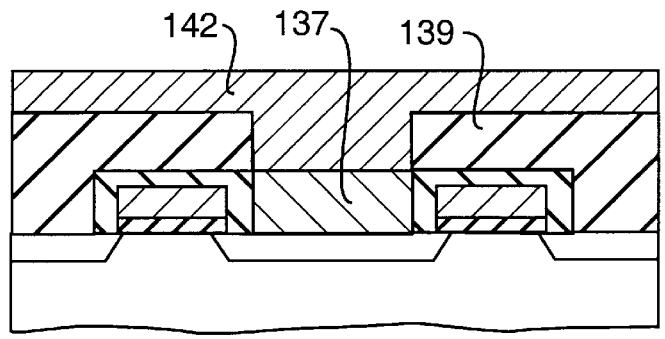

FIGS. 23A through 23C are section views showing a method for forming a resist pattern according to a tenth embodiment of the present invention. Because the basic principle of the present embodiment is the same as that of the ninth embodiment, reference will be made to the ninth embodiment as to the matters which are the same as the ninth embodiment and a detailed explanation thereof will be omitted here.

In FIG. 23A, a gate insulating layer 133 and a gate electrode 134 are formed on an underlying substrate 131 made of semiconductor. An insulating layer 135 is formed on the gate electrode 134 so as to cover the gate electrode 134. Diffusion layers 136a and 136b are formed on the surface of the substrate 131. A plug electrode 137 is formed on the diffusion layer 136b and a luminescent layer 138 containing phosphor is formed on the upper face of the plug electrode 137 in the same pattern with the plug electrode 137. An interlayer insulating film 139 is formed on the luminescent layer 138 and the insulating layer 135, and a positive type resist 140 is formed on the interlayer insulating film 139.

Next, the positive type resist 140 is exposed via a photo mask 141 having a light transmitting portion 141a and light shielding portions 141b. The light transmitting portion 141a is patterned as an opening. As shown in FIG. 23A, the width of the opening pattern of illumination light A projected on the resist 140 is wider than the pattern width of the luminescent layer 138 and the plug electrode 137.

Basic steps shown in FIGS. 23A through 23C are the same as those of the ninth embodiment shown in FIGS. 21A through 21C. At first, when the illumination light A is illuminated, the resist 140 is sensitized selectively only on the domain in which the illumination domain intersects the domain in which the luminescent layer 138 is formed as shown in FIG. 23A. Next, as shown in FIG. 23B, the resist 140 is developed and only the resist 140 sensitized by the luminescent light B from the luminescent layer 138 is removed, forming a resist pattern 140a in the fashion of self-alignment with respect to the plug electrode 137 and the luminescent layer 138.

Further, the interlayer insulating film 139 and the luminescent layer 138 are etched anisotropically using the resist pattern 141a as a mask to form a contact hole in the fashion of self-alignment with respect to the plug electrode 137 and the luminescent layer 138. Finally, as shown in FIG. 23C, the resist pattern 141a is removed and a wiring layer 142 is formed so as to be connected with the plug electrode 137 via the contact hole.

Although the luminescent layer 138 has been formed on the plug electrode 137 in the steps shown in FIGS. 23A through 23C, the plug electrode 137 may contain phosphor by itself.

It is noted in the ninth and tenth embodiments described above that an i-line, ArF excimer laser, X-ray, electron beam and the like may be used beside the KrF excimer laser for the electromagnetic wave such as light to be irradiated to the luminescent layer.

[Eleventh Embodiment]

Figure 24A:
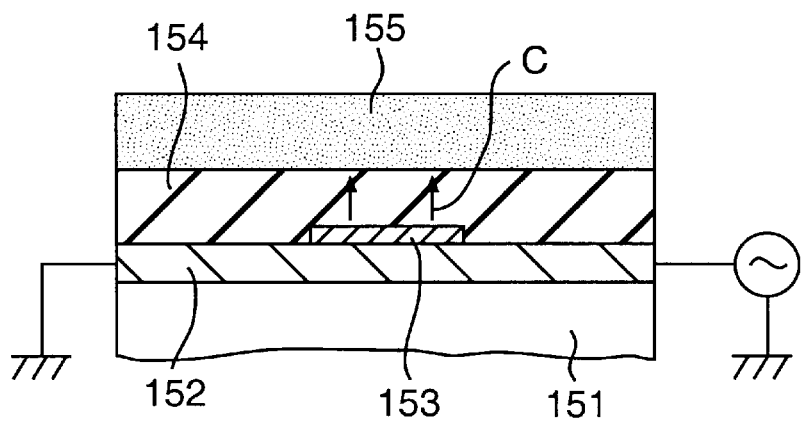
FIGS. 24A through 24C are section views showing a method for forming a resist pattern according to an eleventh embodiment of the present invention.
Figure 24B:
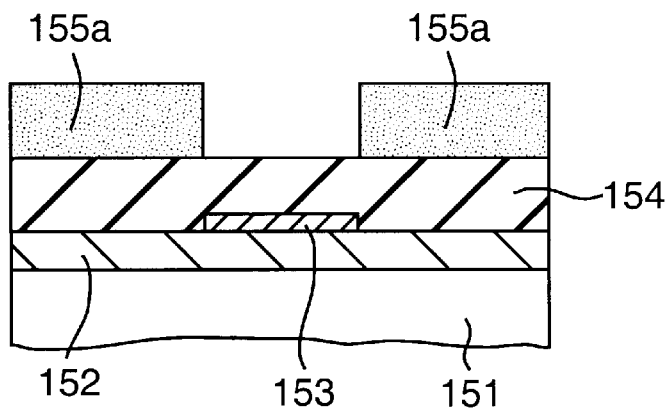
Figure 24C:
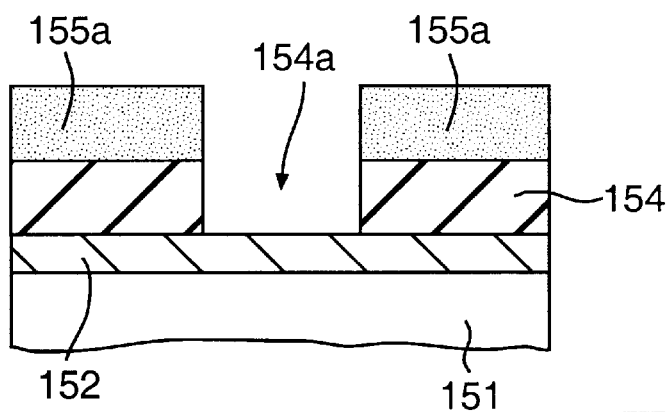

FIGS. 24A through 24C are section views showing a method for forming a resist pattern according to an eleventh embodiment of the present invention. Although the luminescent light has been brought about from the luminescent layer by an electromagnetic wave such as light in the ninth and tenth embodiments described above, luminescent light is brought about from the luminescent layer by utilizing an electro-luminescent phenomenon in the present embodiment. Because the structure and others of the present embodiment are partially similar to the ninth embodiment, reference will be made to the ninth embodiment as to the matters that are the same as the ninth embodiment, and a detailed explanation thereof will be omitted here.

As shown in FIG. 24A, a wiring layer 152 is formed on an underlying substrate 151 made of a semiconductor or the like and a luminescent layer 153 containing phosphor is formed on the wiring layer 152. The luminescent layer 153 is patterned into a predetermined pattern by means of etching. An interlayer insulating film 154 is formed on the whole surface of the luminescent layer 153 and the wiring layer 152. This interlayer insulating film 154 is formed by using a material having a high transmissivity to luminescent light C, such as silicon oxide formed by means of CVD. A positive type resist 155 is formed on the interlayer insulating layer 154.

Next, pulsating AC field is applied to the wiring layer 152 to flow current therein. Thereby, luminescent light C is emitted from the luminescent layer 153 by the electroluminescent phenomenon. The resist right above the luminescent layer 153 is sensitized by this luminescent light C in the fashion of self-alignment with respect to the luminescent layer 153.

After finishing the step in FIG. 24A, the resist 155 is developed, and only the resist sensitized by the luminescent light C from the luminescent layer 153 is removed. As a result, a resist pattern 155a is formed in the fashion of self-alignment with respect to the luminescent layer 153 as shown in FIG. 24B. Further, the interlayer insulating film 154 is etched anisotropically by using the resist pattern 155a as a mask to form a contact hole 154a in the fashion of self-alignment with respect to the luminescent layer 153 as shown in FIG. 24C. At the same time, the luminescent layer 153 may be removed.

If the luminescent layer 153 and the wiring layer 152 are formed into a pattern having the same line width as each other, the resist pattern 155a may be formed in the fashion of self-alignment with respect to the pattern of the luminescent layer 153, i.e. to the pattern of the wiring layer 152. This method will be explained below with reference to FIGS. 25A and 25B.

Figure 25A:
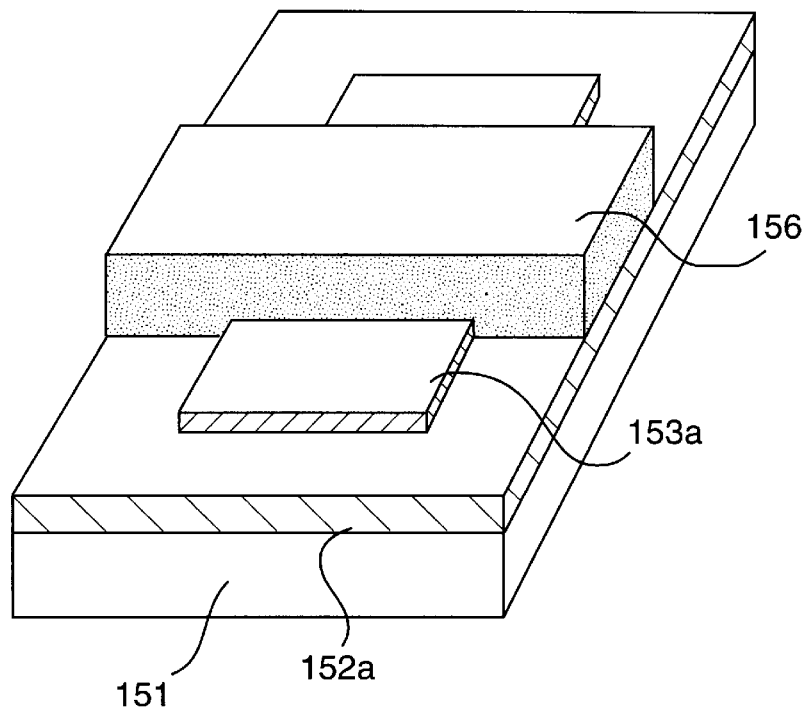
FIGS. 25A and 25B are section views showing another method for forming a resist pattern according to the eleventh embodiment of the present invention.
Figure 25B:
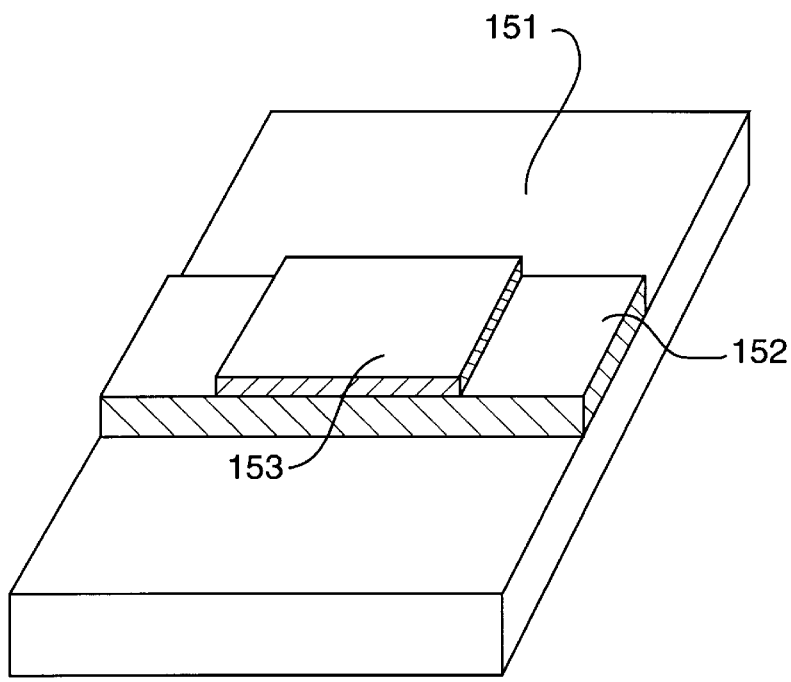

As shown in FIG. 25A, a luminescent layer 153a having a certain length is formed at first on a wiring layer 152a, and a resist pattern 156 having a certain line width is formed on the wiring layer 152a and the luminescent layer 153a. The wiring layer 152 and the luminescent layer 153 having the same line width as the wiring layer 152 may be formed by etching the luminescent layer 153a and the wiring layer 152a in order by using this resist pattern 156 as shown in FIG. 25B.

Thereafter, the contact hole 154a may be formed in the fashion of self-alignment with respect to the luminescent layer 153, i.e. to the wiring layer 152, by implementing the steps shown in FIGS. 24A through 24C. It is possible to form the resist pattern in the fashion of self-alignment without using a mask in forming the contact hole as in the ninth and tenth embodiments, by patterning the luminescent layer 153 in advance so that it becomes a pattern of the contact hole 154a.

Although current flows between both ends of the wiring layer 152 in the example shown in FIG. 24A, it is also possible to irradiate microwave to the wiring layer 152 to generate an alternating current.

It is noted that the examples in which the positive type resist is used have been shown in the ninth through eleventh embodiments described above, the same effect may be obtained also when a negative type resist is used.

While preferred embodiments have been described, variations thereto will occur to those skilled in the art within the scope of the present inventive concepts which are delineated by the following claims.

What is claimed is:

1. A method for forming a resist pattern, comprising the steps of:
    preparing a substrate including, on the surface thereof, first and second domains having different reflectivity to a first light;
    covering said first and second domains having different reflectivity with a positive resist;
    irradiating said resist with said first light in a predetermined pattern including at least part of said first domain and at least part of said second domain; and
    developing said resist irradiated with said first light;
    wherein said first light is reflected from the surface of said first and second domains, causing a second light as reflected light, and the reflectivity of said first domain to said first light is greater than the reflectivity of said second domain, and
    wherein a sum of an exposure of said resist exerted by said first light and an exposure of said resist exerted by said second light is set above a threshold of exposure at which a dissolving speed of said resist changes in said first domain and set below said threshold of exposure in said second domain, and said resist is removed selectively on a domain in which said first domain and said predetermined pattern overlap each other.

2. The method for forming the resist pattern according to claim 1, wherein said first domain is a first electrode or wiring, the step of irradiating said resist with said first light includes a step of irradiating said first light via a photo mask having a light transmitting portion and a light shielding portion, and said photo mask has an alignment pattern width wider than said first electrode or wiring, said alignment pattern corresponding to said predetermined pattern.

3. The method for forming the resist pattern according to claim 2, further comprising the steps of:
    covering said first electrode or wiring with an insulating film which transmits said first light and second light;
    exposing the surface of said first electrode or wiring by etching said insulating film using said resist pattern formed on said insulating film as a mask; and forming an upper wiring layer connected to said first electrode or wiring.

4. The method according to claim 3, wherein a longitudinal direction of said alignment pattern crosses a longitudinal direction in which said first electrode or wiring extends, and said insulating film is removed selectively on said domain in which said first domain and said alignment pattern overlap each other using said resist as said mask, to form a contact hole for connecting said upper wiring layer to said first electrode or wiring.

5. The method according to claim 4, wherein said longitudinal direction of said alignment pattern crosses vertically said longitudinal direction in which said first electrode or wiring extends.

6. The method for forming the resist pattern according to claim 4, further comprising the steps of:
    forming a second electrode or wiring under said first electrode or wiring before forming said first electrode or wiring, said second electrode or wiring having a portion not underlying said first electrode or wiring;
    forming an anti-reflective coating for preventing reflection of said first light selectively on said first electrode or wiring;
    forming an insulating film which transmits said first light and second light on said anti-reflective coating so as to cover said first electrode or wiring;

exposing the surface of said second electrode or wiring by etching said insulating film using said resist pattern formed on said insulating film as a mask; and forming an upper wiring layer connected to said second electrode or wiring.

7. A method for forming a resist pattern, comprising the steps of:

forming a transistor containing a gate electrode, a source layer, and a drain layer and a device separating insulating film for separating said transistor from a substrate; and forming a semiconductor layer on the entire surface of said transistor and device separating insulating film, said semiconductor layer being formed of the same materials as said source and drain layer, and said gate electrode and said semiconductor layer having different reflectivity to a first light;

covering said semiconductor layer with a positive resist;

irradiating said resist with said first light; and developing said resist irradiated with said first light;

wherein said first light is reflected from the surface of said gate electrode and said semiconductor layer, causing a second light as reflected light, and the reflectivity of said gate electrode to said first light is greater than the reflectivity of said semiconductor layer, and wherein a sum of an exposure of said resist exerted by said first light and an exposure of said resist exerted by said second light is set above a threshold of exposure at which a dissolving speed of said resist changes above said gate electrode and set below said threshold of exposure above said source and drain layer, and said resist is left selectively above said source and drain layer.

8. A method for forming a resist pattern, comprising the steps of:

forming a transistor containing a gate electrode, a source layer, and a drain layer and a device separating insulating film for separating said transistor from a substrate, said source and drain layer being formed between said gate electrode and device separating insulating film and lower than said gate electrode; and forming a semiconductor layer on the entire surface of said transistor and device separating insulating film;

covering said semiconductor layer with a negative resist; and irradiating said resist with said first light;

wherein said first light is reflected from the surface of said semiconductor layer, causing a second light as reflected light, and said second light is concentrated to said resist formed above said source layer and drain layer to form said resist pattern.

9. A method for forming a resist pattern, comprising the steps of:

forming a first area of first radiation reflectance and a second area of second radiation reflectance on a substrate, said first radiation reflectance being higher than said second radiation reflectance; and covering said first and second areas with a positive resist;

irradiating the substrate with radiation at a level below the level to sensitize the resist in a predetermined pattern including at least part of said first area and at least part of said second area; and developing said resist irradiated with said radiation;

wherein said first area of first radiation reflectance reflects radiation so that the resist receiving the reflected radiation is sensitized selectively on an area in which said first area and said predetermined pattern overlap each other.

10. The method according to claim 9, wherein the step of forming said first area of first radiation reflectance includes depositing a conductive material.

11. The method according to claim 10, further comprising the steps of:

covering said conductive material with an insulating film which transmits said radiation;

exposing the surface of said conductive material by etching said insulating film using said resist pattern formed on said insulating film as a mask; and forming an upper conductive layer connected to said conductive material;

wherein a longitudinal direction of said predetermined pattern crosses a longitudinal direction in which said conductive material extends, and said insulating film is removed selectively on said area in which said first area and said predetermined pattern overlap each other using said resist as said mask, to form a contact hole for connecting said upper conductive layer to said conductive material.

12. The method according to claim 11, wherein said longitudinal direction of said predetermined pattern crosses vertically said longitudinal direction in which said conductive material extends.

13. The method according to claim 9, wherein the step of forming said first area of first radiation reflectance includes depositing a material selected from the group consisting of Al, Cu, W, WSi, and polysilicon.

14. The method according to claim 9, wherein the step of irradiating the substrate includes placing a mask between a radiation source and the substrate.

* * * * *